United States Patent [19]

Meier

[11] 4,021,647

[45] May 3, 1977

[54] ELECTRONIC MONITORING DEVICE FOR POWER PRESS BRAKES AND SIMILAR DEVICES

[75] Inventor: Carl H. Meier, Davenport, Iowa

[73] Assignee: Gulf & Western Industries, Inc., New York, N.Y.

[22] Filed: Oct. 17, 1975

[21] Appl. No.: 623,439

Related U.S. Application Data

[63] Continuation-in-part of Ser. No. 478,979, June 13, 1974, Pat. No. 3,930,142.

[52] U.S. Cl. .................. 235/92 TF; 235/92 DN; 235/92 T; 235/92 R; 235/92 PE
[51] Int. Cl.² ................................................ G06M 3/02
[58] Field of Search ......... 73/121, 129; 235/92 TF, 235/92 PE, 92 T, 92 FQ, 92 TC, 92 DN, 103, 103.5 R; 340/52 R, 52 A, 220, 267, 71

[56] References Cited

UNITED STATES PATENTS

| 2,447,588 | 8/1948 | McNairn | 235/92 FQ |
|---|---|---|---|
| 2,851,596 | 9/1958 | Hilton | 235/92 TF |
| 3,158,854 | 11/1964 | Keen et al. | 235/92 TF |
| 3,525,044 | 8/1970 | Richmond | 235/92 TF |
| 3,673,563 | 6/1972 | Thielen et al. | 73/129 |
| 3,708,750 | 1/1973 | Bucks et al. | 235/92 DN |
| 3,865,305 | 2/1975 | Sampey | 235/92 PE |

*Primary Examiner*—Joseph M. Thesz
*Attorney, Agent, or Firm*—Meyer, Tilberry & Body

[57] ABSTRACT

There is provided an electronic monitoring device for indicating when the stopping time or stopping distance of a brake adapted to stop the motion of the power press drive system exceeds a preselected time or distance. In accordance with one aspect of this device, there is provided means for creating a selected number of control pulses having a time spacing between successive control pulses inversely proportional to the rotational velocity of the press shaft, a digital counter having an input for counting pulses and means for starting the counter upon creation of a stop signal for the press, means for creating counting pulses having a known time base frequency, means for directing the counting pulse to the input of the digital counter, means for creating a first signal when the digital counter has counted to a selected number, means for creating a second signal when the time spacing of successive control pulses exceeds a preselected time and indicating means actuated upon creation of the first signal before creation of the second signal.

30 Claims, 17 Drawing Figures

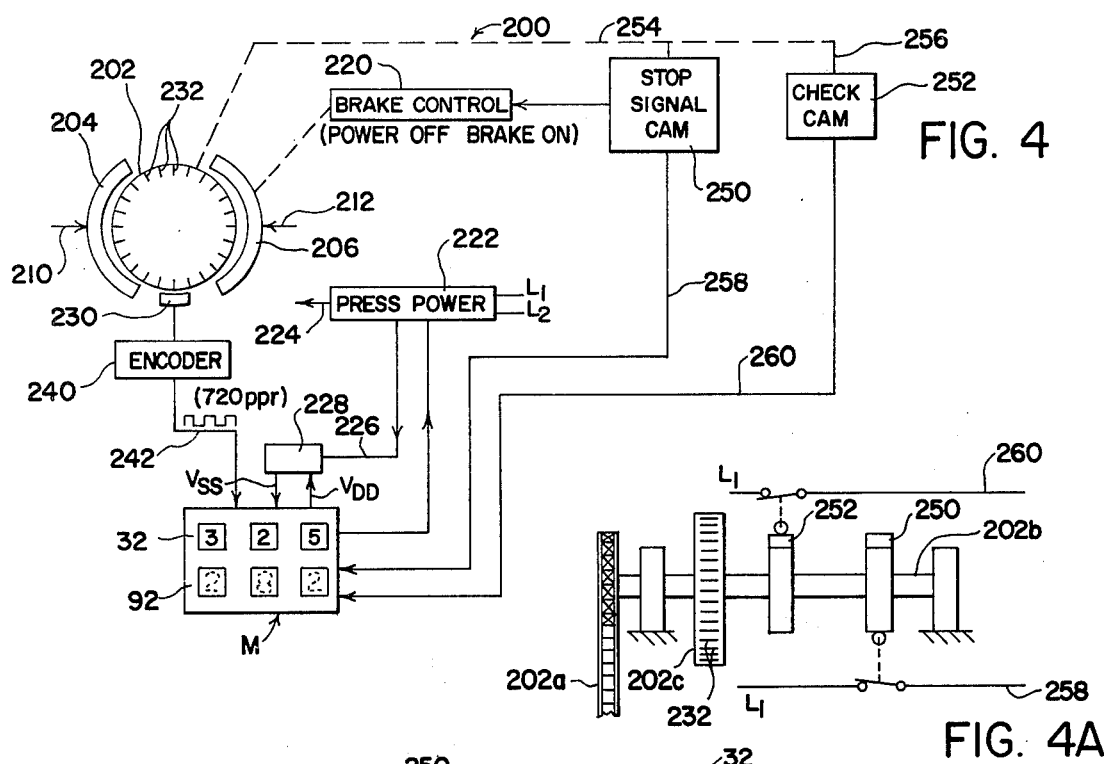
FIG. 4
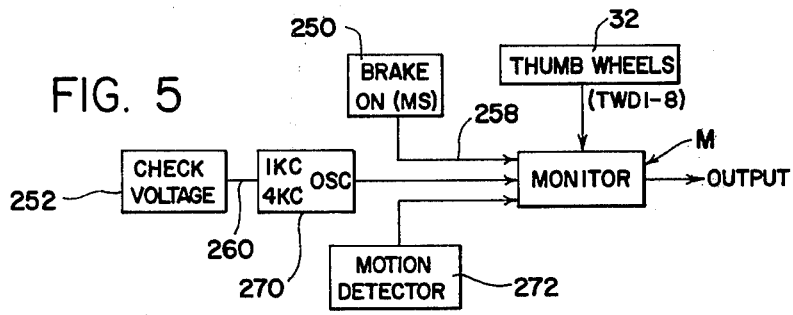
FIG. 4A
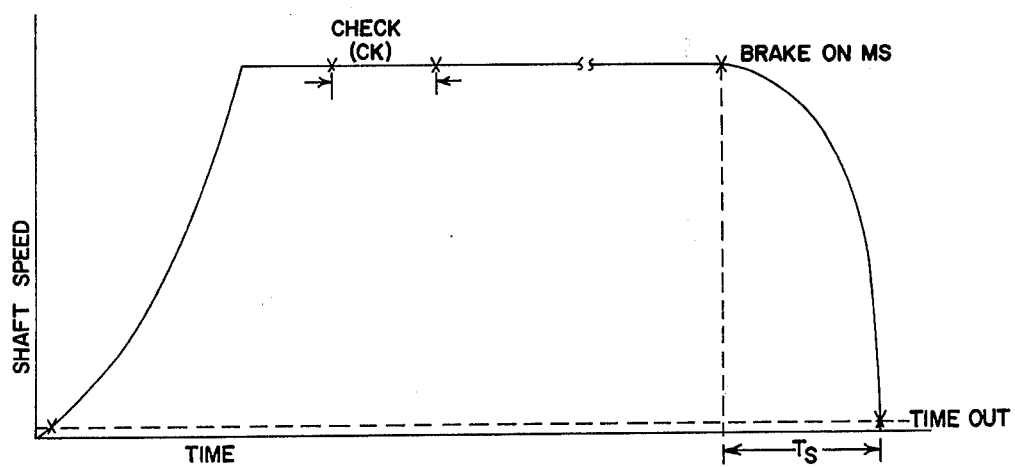
FIG. 5
FIG. 7

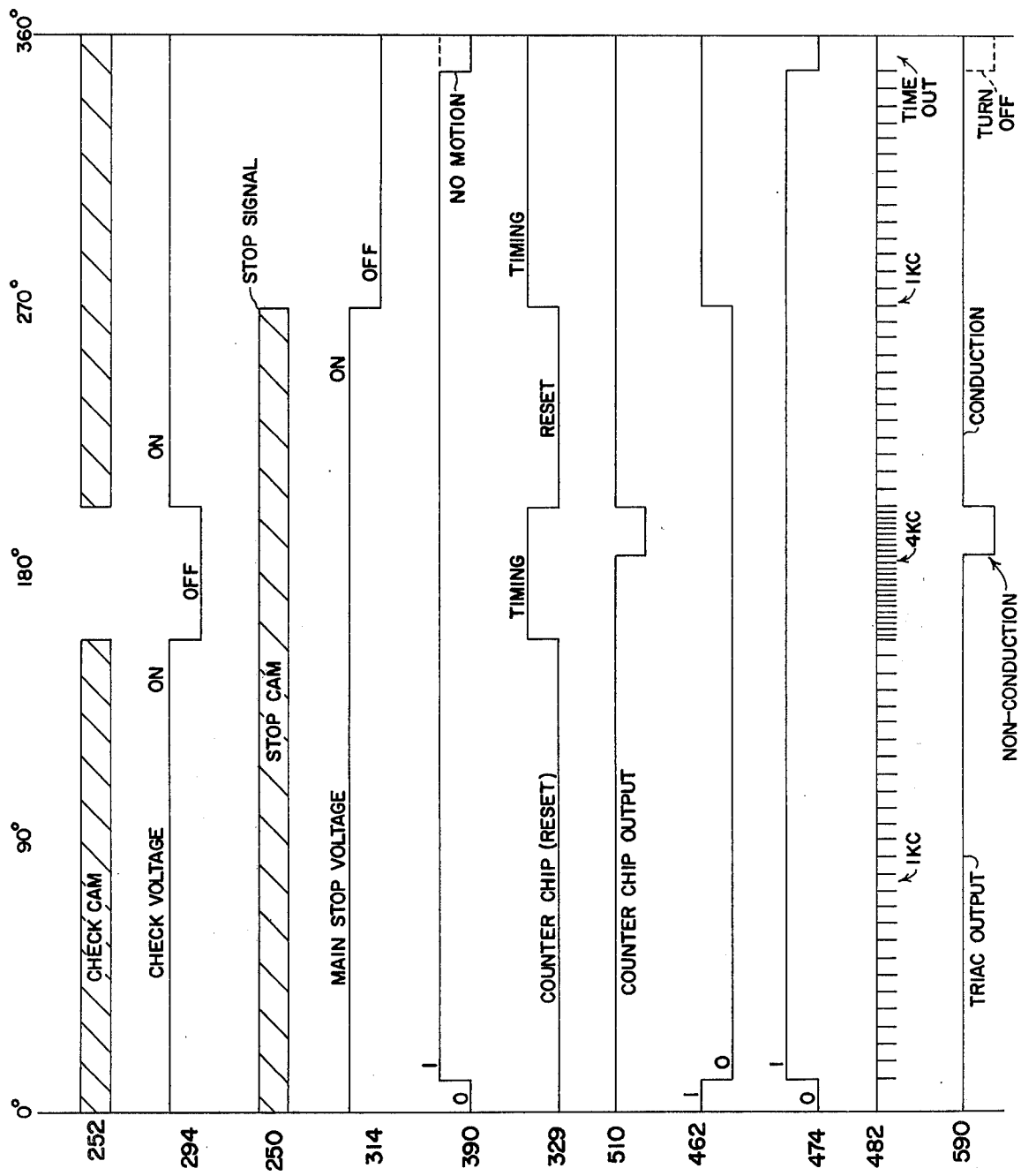

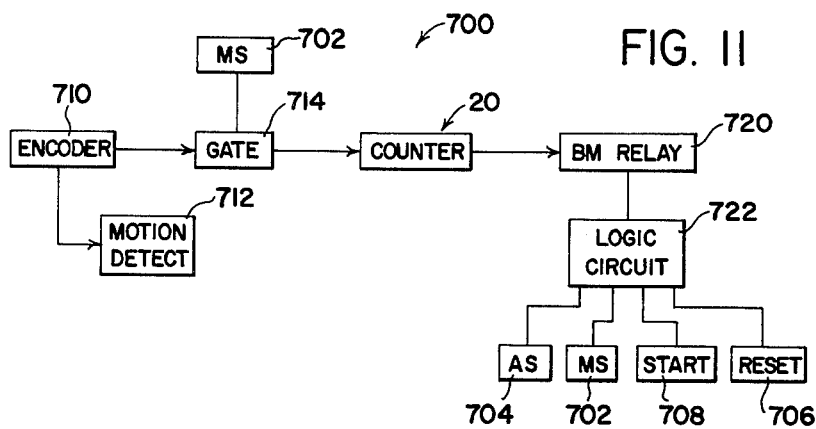
FIG. 11
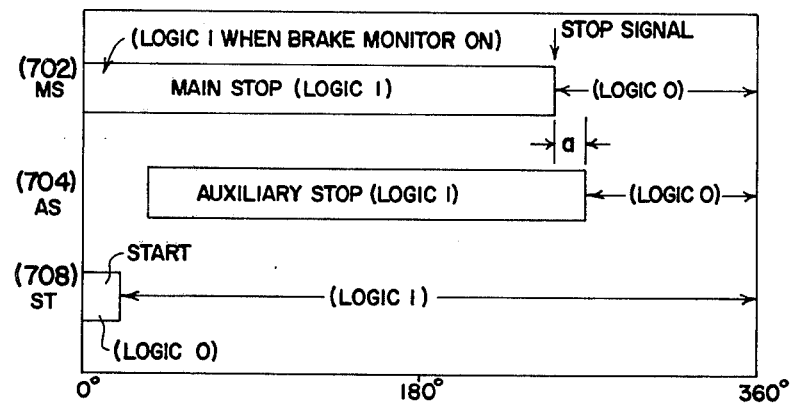
FIG. 12
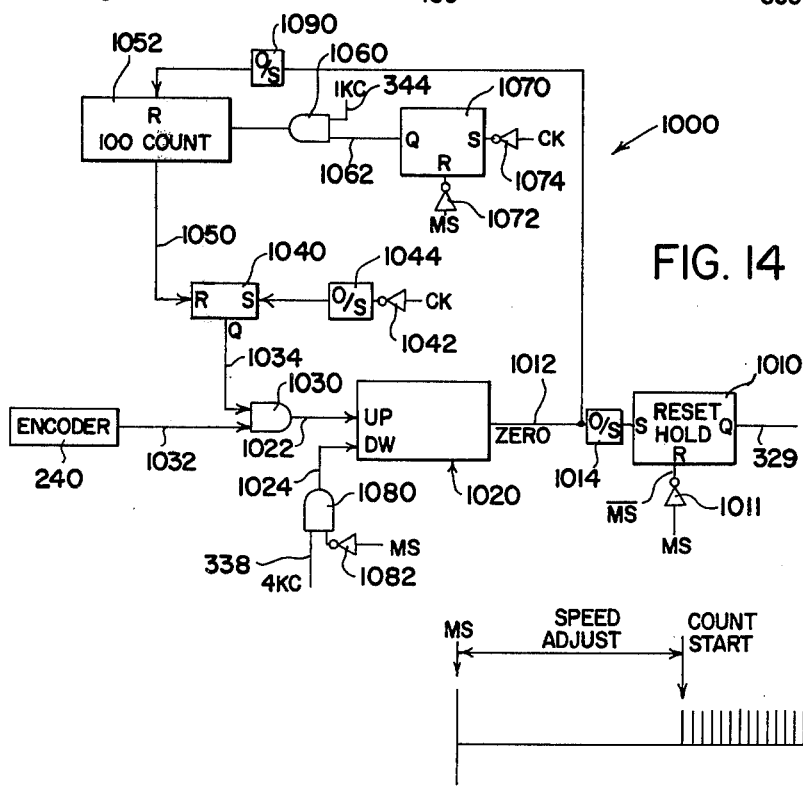
FIG. 14
FIG. 15

ELECTRONIC MONITORING DEVICE FOR POWER PRESS BRAKES AND SIMILAR DEVICES

This is a continuation-in-part application of my prior application Ser. No. 478,979 filed June 13, 1974 now U.S. Pat. No. 3,930,142.

This invention relates to the art of power presses and more particularly to an electronic monitoring device for a power press brake system.

The invention is particularly applicable for monitoring the operation of a power press brake by sensing rotational velocity of the press drive shaft during a braking cycle of the press stroke and it will be described with particular reference thereto; however, it is appreciated that the invention has much broader applications and may be used for monitoring the operation of a brake used in braking various mechanical driving systems sensing the angular or rotational velocity of a shaft driven by the drive system and/or the angular displacement of such a shaft during the brake cycle.

PRIOR APPLICATION

The present application is a continuation-in-part of prior application Ser. No. 478,979, filed June 13, 1974, and this application is incorporated by reference herein to the extent that the common subject matter is not specifically disclosed.

BACKGROUND OF INVENTION

In power presses, often the press is stopped after each operating stroke by the application of friction brakes acting upon the drive system of the press. These brakes are applied when the press reaches a certain position in its cycle and a stop signal is created. At the time the brakes are applied, the main power to the drive system is disconnected. In this manner, the brake stops the power press at the end of each cycle. In some power press operations, multiple cycles are performed before a stop signal actuates the brake and disconnects the power to the press drive system.

When the brake of a power press becomes worn or defective, it must be repaired or replaced to assure safe operation of the press. Under normal circumstances, deterioration of the power press brake is not recognizable until the brake has developed a substantial defect. For this reason, preventive maintenance is often required which involves the periodic repair and/or replacement of brakes which are still functioning properly. This type program requires a substantial amount of labor and time and adds to the total expense of operating power presses. Thus, there has developed a substantial demand for a device which will indicate when a power press brake should be replaced or repaired. Indeed, federal regulations are now being imposed which require that power presses be monitored in their braking cycle to determine when brakes deteriorate to a certain condition. The monitored condition still allows safe operation but indicates that a repair or replacement is needed. To satisfy the desire to eliminate unnecessary, periodic preventive maintenance on power brakes and also to meet the federal regulations, power press manufacturers and users are now in the process of developing systems for monitoring the operation of a power press brake during each braking cycle. Most of these systems involve the use of a cam which indicates overtravel at the end of a stroke or press cycle. These systems require sensitive mechanical adjustments and can often provide false deterioration signals due to shifting of the cams and their position of operation.

THE INVENTION

The present invention relates to an electronic monitoring device for a power press brake or other drive system of a similar type which provides continuous monitoring during each braking cycle, meets federal regulations and is positive in operation over long periods.

In accordance with the present invention, there is provided an electronic monitoring device of the type described above which includes a digital counter having an input for counting pulses, means for starting a counter interval of the counter in response to a stop signal, means for terminating the counting interval when the shaft is stopped, means for applying counting pulses to the counter input, means for creating a first signal when the digital counter has counted to a selected number indicative of proper brake action, means creating a second signal when the shaft has stopped, and indicating means actuated upon creation of the first signal before the second signal.

In accordance with a more specific aspect of the present invention, the above defined electronic monitoring device includes a pulse creating means for creating a pulse during each movement of the shaft through a selected angle. In this manner, the counted pulses during the counting interval relate to the angular displacement of the press drive shaft or a shaft driven thereby to determine that the brake has stopped the shaft within a given angular displacement.

In accordance with another specific aspect of the invention, a monitoring device as defined above includes a pulse creating means for creating a generally fixed time base train of counting pulses. In this manner, the time necessary for stopping the press drive system is monitored.

In accordance with another aspect of the present invention, there is provided an electronic monitoring device for indicating when the stopping time of a brake, adapted to stop the motion of a mechanical drive system upon receipt of a stop signal, exceeds a preselected time. The drive system includes a shaft rotating at a velocity corresponding to the motion of the drive system, means for creating a stop signal and means for applying the brake in response to and/or simultaneously with the stop signal. The monitoring device, in accordance with this aspect of the present invention, includes a means for creating a selected number of control pulses having a timed spacing between successive control pulses inversely proportional to the rotational velocity of the shaft, a digital counter having an input for counting pulses and means for stopping the counter upon creation of the stop signal; means for creating counting pulses having a known time based frequency, means for directing the counting pulses to the input of the digital counter, means for creating first signal when the digital counter has counted to a selected number, means for creating a second signal when the time spacing of successive control pulses exceeds a preselected time and indicating means actuated upon creation of the first signal before creation of the second signal.

In this manner, as long as the digital counter does not time out until the power press brake is stopped, there is no indication of a fault. When the counter does count out before the press is stopped, there is a fault indication which disconnects the power source to the press and retains the brake in operation until corrective measures are taken. Without a fault indication during the brake cycle, an operator can be assured that the brake is stopping the power press or drive system within the acceptable time and/or distance.

The primary object of the present invention is the provision of an electronic monitoring device for a mechanical drive system of the type used in power presses, which monitoring device monitors the operation of a press brake during each braking cycle and indicates, for each brake cycle, when a selected level of brake deterioration occurs or when the brake is otherwise operating in a manner not desired.

Yet another object of the present invention is the provision of an electronic monitoring device, of the type described above, which device uses a digital counter as the basic control element and utilizes electronic logic circuitry in combination with such a counter.

Still a further object of the present invention is the provision of a monitoring device, as described above, which device is uniform in operation over long periods.

Still a further object of the present invention is the provision of a monitoring device, as mentioned above, which device includes internal testing circuitry which functions during each press cycle to determine the internal condition of the monitor.

Still a further object of the present invention is the provision of a monitoring device, as defined above, which device is relatively inexpensive and dependable in use.

Still a further object is the provision of a device as defined above, which device can be attached to any power press without substantial modification.

Another object of the present invention is the provision of a monitoring device, as described above, which device does not depend upon the spacing of two or more cams or other mechanical detectors which can be unreliable over long periods of use.

These and other objects and advantages will become apparent from the following description taken together with the accompanying drawings.

BRIEF DESCRIPTION OF THE DRAWINGS

In the drawings of this application, the figures are set forth as follows:

FIG. 4 is a schematic block diagram illustrating the environment and use of one preferred embodiment of the present invention;

FIG. 4A is a schematic view illustrating an arrangement for creating input information in the preferred embodiment of the present invention, as set forth in FIG. 4;

FIG. 5 is a further block diagram illustrating certain components of the first preferred embodiment of the present invention;

FIG. 7 is a velocity graph illustrating operating characteristics of the first preferred embodiment as shown in FIG. 6;

FIG. 8 is a combined cam and logic diagram illustrating operating characteristics of the first preferred embodiment, as shown in FIG. 6;

FIG. 11 is a block diagram illustrating a second preferred embodiment of the invention;

FIG. 12 is a chart indicating certain operating characteristics of the second preferred embodiment illustrated schematically in FIG. 11;

FIG. 14 is a schematic diagram illustrating another aspect of the present invention which may be used in both of the disclosed embodiments of the invention; and, FIG. 15 is a chart showing the operating characteristics of the aspect of the invention disclosed in FIG. 14.

FIRST PREFERRED EMBODIMENT

Figure 6A:
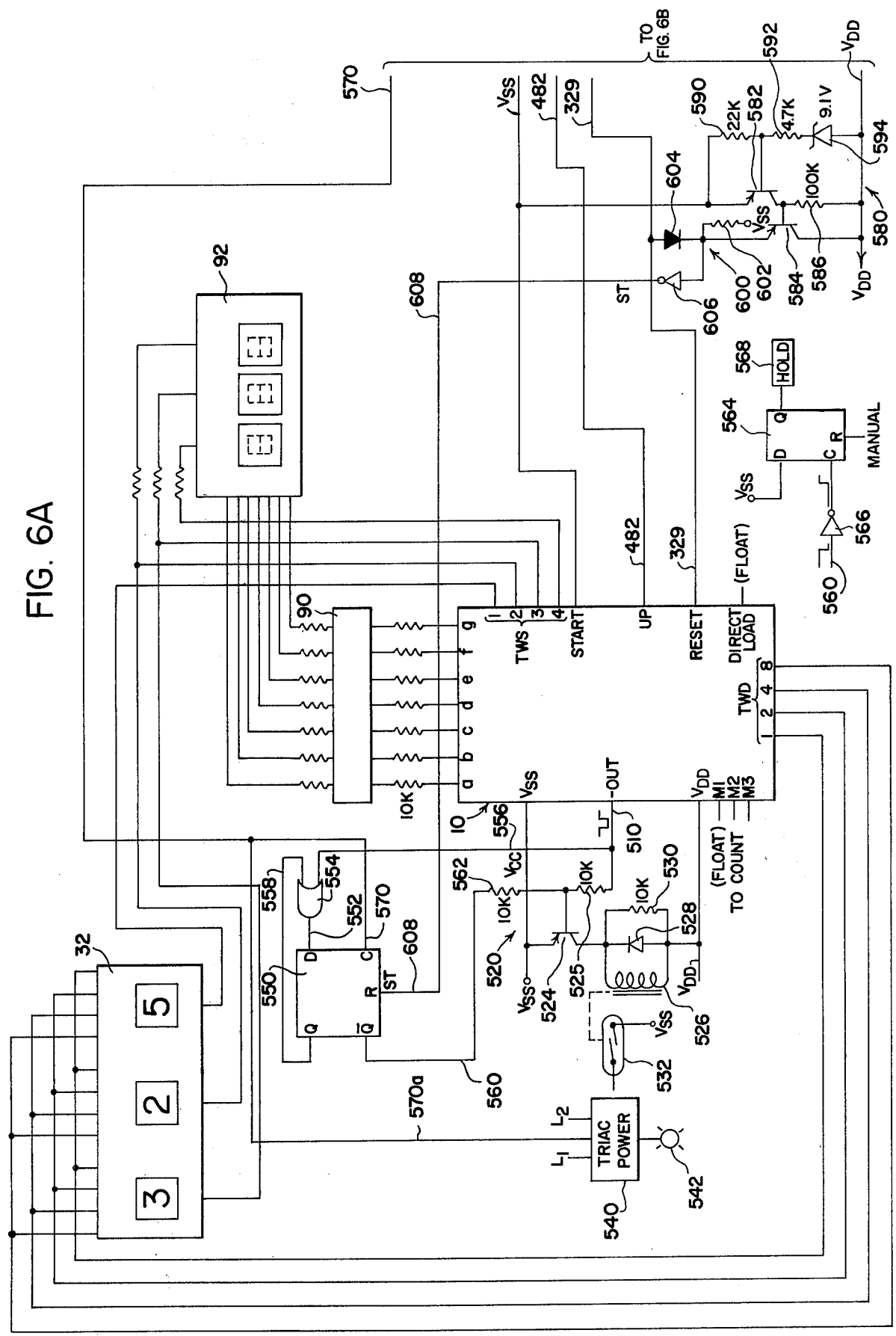
FIG. 6, including FIGS. 6A, 6B taken jointly, is a schematic wiring and logic diagram illustrating the first preferred embodiment of the present invention.
Figure 6B:
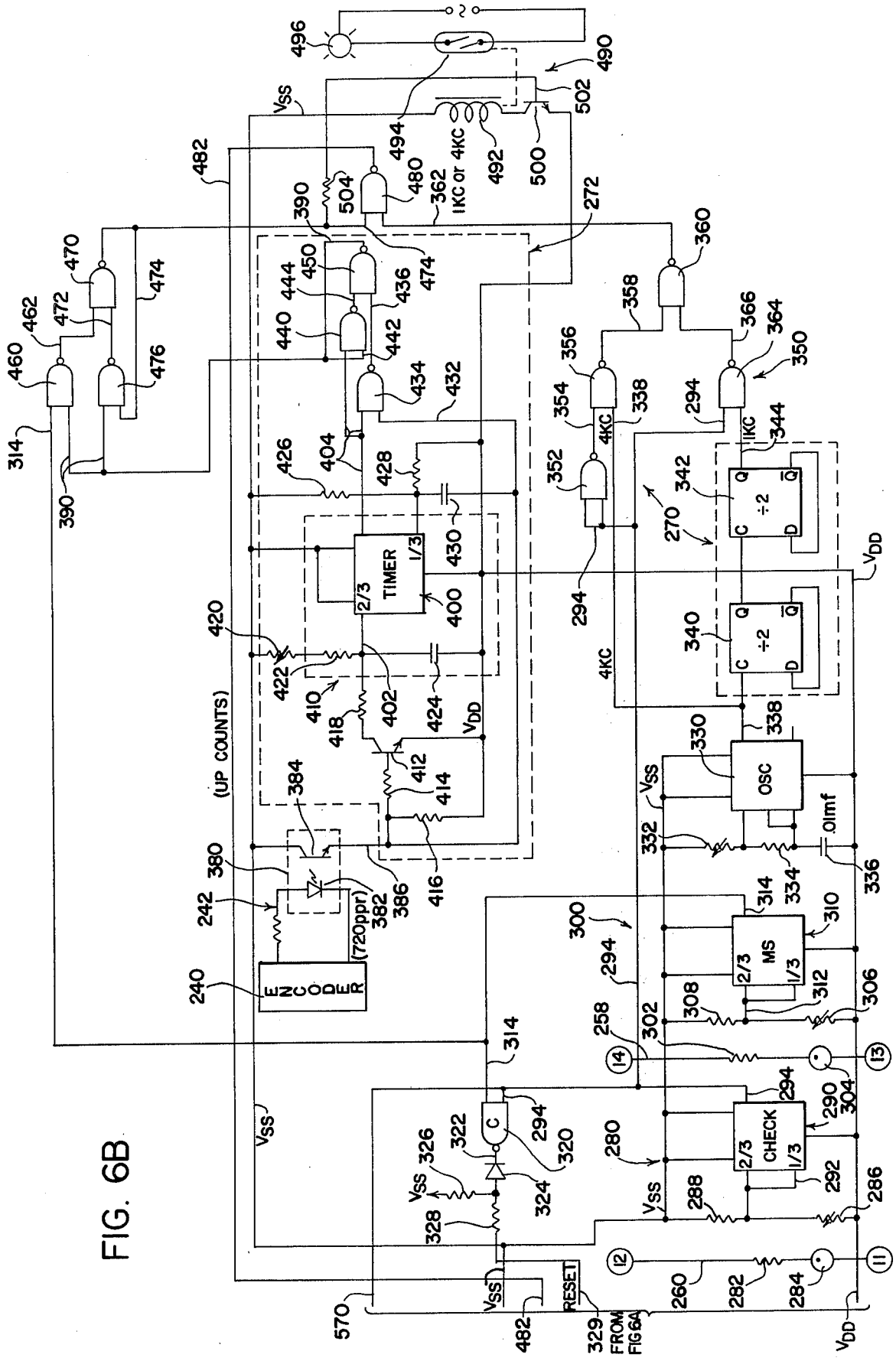

Before describing the first preferred embodiment of the invention as shown in FIG. 6, a general description will be made of the digital counting device employed in this preferred embodiment. This digital counting device is shown schematically in FIGS. 1, 2 and 3. Thereafter, certain general aspects of the invention will be described in connection with FIGS. 4 and 5. This will be followed by a detailed description of the first preferred embodiment of the present invention as best shown in FIG. 6, including FIGS. 6A, 6B to be taken jointly.

GENERAL DESCRIPTION OF THE DIGITAL COUNTING DEVICE USED IN THE PREFERRED EMBODIMENT

Figure 1:
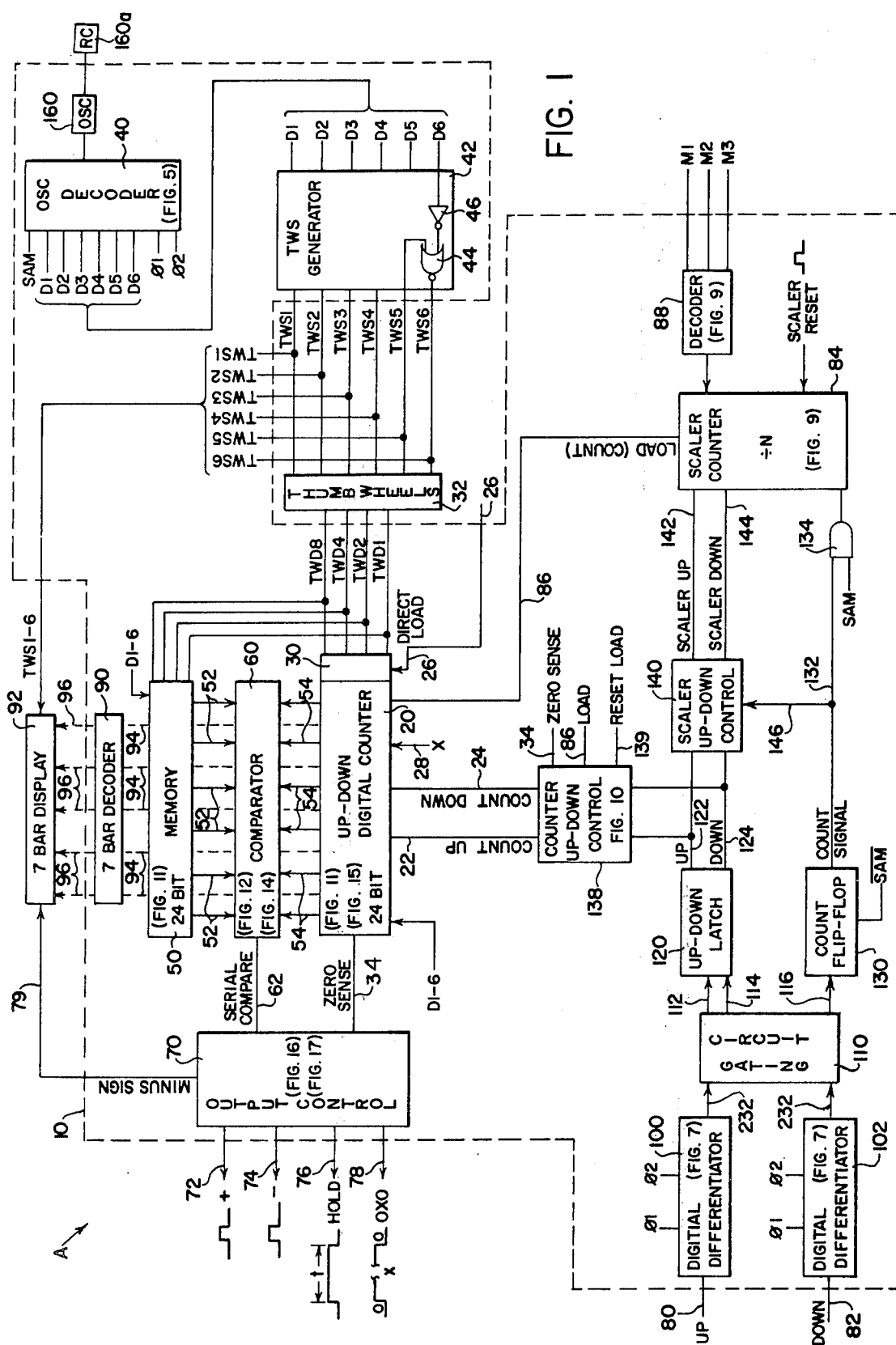
FIG. 1 is a schematic diagram illustrating the internal function of the LSI chip used in the preferred embodiment of the present invention and as illustrated in prior application Ser. No. 478,979, filed June 13, 1974 now U.S. Pat. No. 3,930,142.

Referring now to the drawings wherein the showings are for the purpose of illustrating the preferred embodiment of the invention only, and not for the purpose of limiting same, FIG. 1, which is identical to a similar drawing in prior application Ser. No. 478,979, filed June 13, 1974, now U.S. Pat. No. 3,930,142, shows, somewhat schematically, a digital counting device A which utilizes a LSI chip 10 designated by the dashed lines. The components within the dashed lines are produced on the chip in accordance with standard MOSFET technology. The chip 10, as anticipated for use in the preferred embodiment of the present invention, includes circuitry for processing six digits which can be loaded either directly into the six digit, 24 bit counter 20 or a six digit, 24 bit memory circuit 50. The digits are selected externally of chip 10 by an appropriate coding arrangement, such as thumbwheel networks, schematically represented as block 32. Chip 10 includes two primary outputs labeled + and −. The + output changes state and creates a signal when the counter counts up and reaches the memory number when in the LOAD DIRECT mode or reaches zero when in the LOAD DIRECT mode. The − output changes state and creates a signal when the counter reaches a set number loaded into the memory circuit. Each of the two primary outputs can be held for a selected time, such as 50 ms when the HOLD output is energized. There are two separate inputs to the chip 10. One input is labeled UP and is used for up counting. The second input is labeled DOWN and is for down counting. Each of these inputs is directed through a divider network or scaler counter 84 which can be programmed so that the internal counting is a multiple of input pulses directed to the chip on the two input terminals. When either of the inputs is connected to a known frequency, such as 120 cps, the counter operates as a timer and the divider network or scaler counter determines the range of the timing cycle. There is included within chip 10 digital differentiators 100, 102 and a gating circuit 110 which prevent counting when pulses are applied simultaneously to the two input terminals of chip 10. In addition, these differentiators and the gating circuit determine the terminal on which an input pulse is received so that the counter in chip 10 functions in accordance with the mode indicated by the input terminal being used.

The 24 bit binary up/down counter 20 can accommodate six digits each including four binary stages. Of course, various changes could be made in the number of digits and bits. Binary counter 20 includes four sections or stages for each digit. Each digit is loaded into the counter as a binary coded digit in accordance with normal counting practices. Line 22, the COUNT UP line, causes the counter to count in the up mode when a signal is applied to line 22. In a like manner, a signal applied to the COUNT DOWN line 24 causes counter 20 to count down. Combined up and down counters are quite well known in the LSI chip field and take a variety of different constructions. Control line 26, designated the DIRECT LOAD line, allows loading of counter 20 when a given logic is applied to this line. When opposite logic, designated as DIRECT LOAD, is applied to this line, loading of the counter itself is inhibited. Line 28 is designated as the X line. This causes a divide by six function at digits three and five from the most significant end of the six digit binary counter 20.

Figure 2:
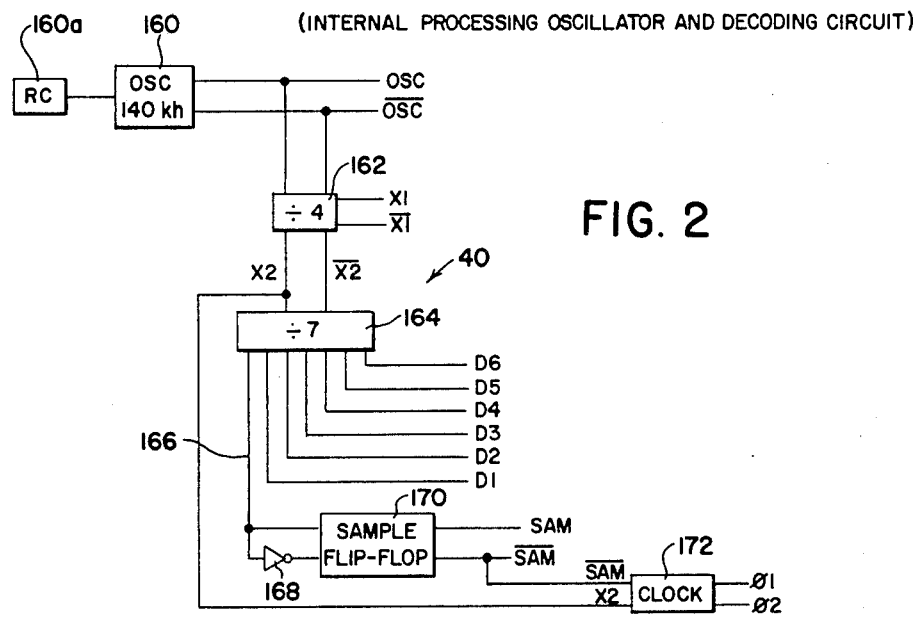
FIG. 2 is a schematic diagram illustrating the internal processing oscillator and coding circuit used in the circuit illustrated in FIG. 1 and shown in the above mentioned prior application.

When loading the six digits into binary counter 20, multiplexing lines D1–D6 are created in series by an oscillator and decoder 40 best shown in FIG. 2. As will be explained later, a number is loaded into counter 20 only when device A is being operated in the DIRECT LOAD mode, i.e. when the counting device is to count down from a number to zero. In this mode, when multiplexing pulse D1 appears, the binary logic on four binary coded decimal lines designated TWD8, TWD4, TWD2 and TWD1 is loaded into the first of the four bit digit stages of counter 20. When a D2 multiplexing pulse is created, after a D1 pulse, new binary coded decimal logic appears on the TWD lines. This new logic represents a second light and is loaded into the second digit stage of counter 20. This is repeated until all of the multiplexing pulses D1–D6 have been created and have loaded the corresponding binary coded decimal information from the TWD lines into the respective six stages of counter 20. Each of the multiplexing lines D1–D6 opens one of the four bit binary digit stages of counter 20 for reception of multiplexed information appearing on the TWD lines in a manner to be described later. The TWD lines are gated through the DIRECT LOAD gate 30 included as part of the counter circuitry and controlled by logic on DIRECT LOAD line 26. When gate 30 is open, loading of counter 20 can take place. When the logic on line 26 closes this gate, the information on the TWD lines cannot pass into the counter.

The logic on the TWS lines is created for multiplexing. A series of thumbwheels, shown as a schematically represented thumbwheel device 32 in FIG. 1, are each adjusted to provide a particular four bit binary coded network for each of the six digits. Six manually adjusted thumbwheels are used in device 32. When one of the multiplexing lines D1–D6 appears, it creates a corresponding TWS pulse which is directed to one of the six binary coded thumbwheel networks in thumbwheel device 32. Each TWS pulse produces a particular binary coded digit set into one stage of device 32 by manually moving the various thumbwheels in accordance with known practice. The binary coded decimal set into each stage of thumbwheel device 32 is directed simultaneously to the four TWD lines, TWD8, TWD4, TWD2, and TWD1. The information on the TWD lines is introduced through the DIRECT LOAD gate 30 into counter 20. It is seen that separate digits are loaded into separate locations in counter 20 under the control of one of the multiplexing lines D1–D6. The output of counter 20 is a ZERO SENSE line 34. A signal appears in this line when the counter 20 has been counted to zero in all six digit stages.

The multiplexing on lines D1–D6 are created by the multiplex decoder 40 shown schematically in FIG. 1 and in more detail in FIG. 2. Multiplexing lines D1–D6 are connected to a TWS generator 42, to create pulse on the thumbwheel selector lines TWS 1–6. Essentially, a pulse on one of the multiplexing lines D1–D6 creates a corresponding pulse on one of the TWS lines. To assure that there is no overlapping between adjacent pulses on the TWS lines, generator 42 includes a NOR gate for each TWS line. Gate 44 has a first input connected to one of the multiplexing lines D1–6 through an inverter 46. The other input to gate 44 is connected to the next adjacent TWS line. Consequently, in order to develop a signal in a subsequent TWS line, such as TWS-6 as represented in block 42 of FIG. 1, the signal on the previous TWS line, i.e. TWS-5, must be zero at the same time that a multiplexing pulse is received on line D6. In this manner, one TWS line must become inactive before the next TWS line can become active. The adjacent multiplexing pulses which appear in lines D1–D6 are not spaced from each other. Consequently, the interconnecting gate arrangement schematically illustrated in FIG. 1 is one scheme to assure that concurrent TWS pulses are not created. A gate 44 is not required for TWS-1 since D1 does not follow immediately after D6.

This description of the multiplexing lines D1–6, the thumbwheel selector lines TWS 1–6, and the thumbwheel decoder lines TWD 8-1 show how these lines are coordinated to multiplex digits into counter 20. The same basic system is used for multiplexing digits set in thumbwheel device 32 into a 24 bit read/write memory circuit 50. In accordance with the preferred embodiment of the invention, the thumbwheel decoder lines TWD 8-1 are directed to the memory circuit 50 and are multiplexed into the various digits by the multiplex lines D1–D6. The multiplexing of the thumbwheel setting of device 32 into the memory circuit 50 and/or the counter 20 is controlled by a gate which is operated only at the start of a counting cycle.

During the counting cycle, lines 52 which read the binary information set into memory circuit 50 and lines 54 which read the binary information in counter 20 are both directed to a compare circuit 60. When the counter 20 is counted up to the setting of memory circuit 50, compare circuit 60 creates a SERIAL COMPARE signal in line 62.

The ZERO SENSE line 34 and the SERIAL COMPARE line 62 are connected to an output control 70 having four outputs 72, 74, 76 and 78. Output 72 is referred to as the + output. Line 74 is the − output. Line 76 is the HOLD output and line 78 is the OXO output. A last output is line 79, which controls the minus sign of the visual display unit 92.

LSI chip 10 includes two terminals forming pulse input lines 80, 82. Line 80 is the UP input, and line 82 is the DOWN input. Input pulses on either of the inputs are directed through certain input circuitry shown in FIG. 1 and described later. The pulses are divided by a pulse divider or scaler counter 84, which is controlled by the logic on code lines M1, M2, M3. An output pulse is created by scaler counter 84 after a given number of input pulses. This pulse is developed in the LOAD or COUNT line 86. The logic of the coded lines M1, M2, M3, which can be manually changed to change the counting range, is decoded by a standard binary decoder 88.

The condition of counter 20 at any given time is directed to a 7-Bar decoder 90 which receives the binary coded decimal for each digit in counter 20 by the operation multiplex lines D1–D6. Decoder 90 controls the 7-Bar visual display 92. The input lines to the decoder are labeled 94 and the output lines connected to display 92 are labeled 96. The 7-Bar display is controlled by the TWS lines 1–6 to coordinate the stages of the display device with the stages of counter 20 being interrogated serially by multiplexing lines D1–6.

Referring now more particularly to the input circuits for the digital counting device A, as shown in FIG. 1. The UP input 80 is connected to a digital differentiator 100 and the DOWN input 82 is connected to digital differentiator 102. These differentiators are controlled by clocking pulses 01, 02, created by the decoder 40 shown in FIG. 2. These clocking pulses advance the signals on the input lines 80, 82 into the input of a gating circuit 110. The first input signal appearing on one of the input lines is started in its gating progress through the differentiator. The next input signal, if on another of the inputs, then progresses behind the first signal to the gating circuit 110 which includes outputs 112, 114 and 116. Outputs 112, 114 carry logic which indicates whether the input signal being accepted by gating circuit 110 is from the UP input 80 or the DOWN input 82. The logic on lines 112, 114 is then used to control an UP-DOWN latch 120 which can be a somewhat standard flip-flop. If the input signal is on the UP line 80, latch 120 activates UP line 122. If the input signal is on DOWN line 82, latch 120 activates DOWN line 124. If two input signals are progressed through the differentiators 100, 102, at the same time, output 116 resets a COUNT flip-flop 130 to a zero output on COUNT SIGNAL line 132. Simultaneous signals on both the UP line 80 and DOWN line 82 are progressed through the differentiators 100, 102 at the same time by clocking pulses 01, 02. This condition prevents a COUNT SIGNAL in line 132. When either an up signal or a down signal is progressed through the respective differentiators, the UP-DOWN latch 120 is set in accordance with the particular signal and COUNT flip-flop 130 is toggled to a logic on line 132 indicating that a count is to be made at scaler counter 84. For the purpose of making the actual count, an AND gate 134 is controlled by the SAM line. This line is an operating or processing strobe which has a width similar to the width of the multiplex lines D1–6 and occurs between D6 and D1. Generation of the SAM signal on the SAM line will be described in connection with the showing of FIGS. 2 and 3. UP line 122 and DOWN line 124 are directed to the counter up-down control 138. This counter control is operated in response to the logic on UP line 122 and DOWN line 124, together with certain other signals, such as the logic on the ZERO SENSE line 34, logic on LOAD or COUNT line 86 and the logic on RESET LOAD line 139. The outputs of circuit 138 are the COUNT UP and COUNT DOWN lines 22, 24, respectively. The scaler up-down control 140 produces a SCALER UP output on line 142 and a SCALER DOWN output on line 144. These are outputs directed to the scaler 84 to determine whether or not the scaler counter should count up or down in accordance with the count signal received upon line 132 through gate 134. In this manner, the scaler is capable of counting up and counting down as well as dividing the pulses on line 132 by a number set by the code lines M1, M2 and M3. Consequently, the scaler counter is capable of totalizing in both directions while dividing by a selected number. The output of scaler up-down control 140 is synchronized with the particular incoming signal by an appropriate means represented by synchronizing line 146.

In the $\overline{\text{DIRECT LOAD}}$ mode, the logic on line 26 prevents loading of the thumbwheel decoding lines TWD1-6 into counter 20. At the start of the cycle, a reset signal clears counter 20 and the memory circuit 50. Thereafter, the information from the thumbwheel device 32 is multiplexed into the memory 50 by serial insertion from the TWS lines. No information from the TWD lines is loaded into counter 20 since line 26 blocks gate 30. Consequently, the thumbwheel settings of device 32 are loaded into only memory circuit 50. The counter is reset to zero. Thereafter, the input pulses are directed to the input by the UP input line 80. The input pulses pass through a digital differentiator 100 to control the gating circuit 100. The up-down latch 120 actuates lines 122, 124 to indicate that the up counting mode is being used. This causes control 138 to actuate COUNT UP line 22. In this same manner, the scaler counter 84 is controlled by lines 142, 144 to count in the up direction. As the input pulses continue, they are directed through count flip-flop 130 to gate 134 by line 132. This causes up counting of counter 20 upon the appearance of each pulse in the LOAD or COUNT line 86. When the memory circuit logic being read by lines 52 matches the counter logic being read by lines 54, comparator 60 is energized to produce a SERIAL COMPARE signal in line 62. This, like the ZERO SENSE signal, actuates the output control 70. A down count on line 82 can be accepted in this mode to reduce the total on counter 20. When there is a SERIAL COMPARE signal, the + output is at a logic 1 and the negative output shifts to a logic 1, which is a negative pulse.

INTERNAL PROCESSING OSCILLATOR AND DECODING CIRCUIT

Figure 3:
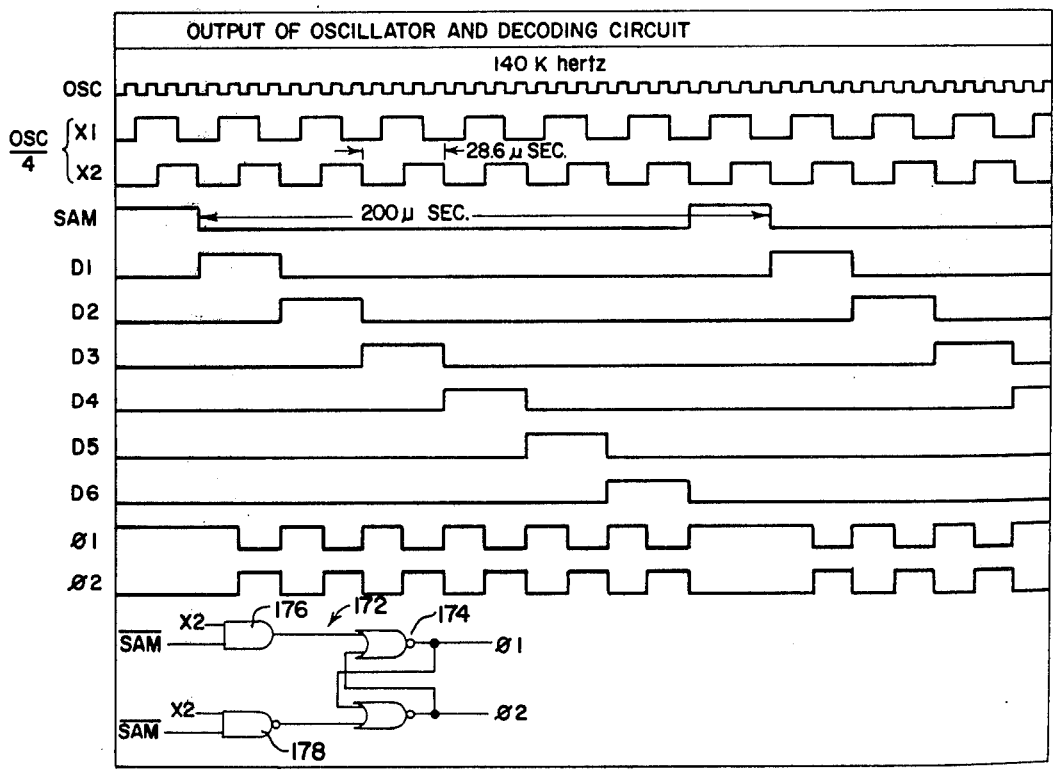
FIG. 3 is a pulse chart indicating the operation of the circuit shown in FIG. 2.

Referring now more particularly to FIGS. 2 and 3, the multiplex decoder 40 is shown as a part of the total internal processing oscillator and decoder circuit. This circuit includes an oscillator 160 controlled by an external RC circuit 160a to oscillate at a selected frequency, which in the preferred embodiment of the invention is 140 kilohertz. The outputs of oscillator 160 are lines OSC and $\overline{OSC}$. Oscillator lines OSC, $\overline{OSC}$ control a divide-by-four divider circuit 162 which produces output pulses on lines X1, $\overline{X1}$ and X2, $\overline{X2}$. The pulsing lines X2, X2 are directed to a divide-by-seven counter circuit 164 having seven outputs, the first being line 166. The remaining output lines are the multiplexing lines D1-6 which receive successive multiplexing pulses. Line 166 includes an inverter 168 so that the inverted and non-inverted logic on this line can be directed to a SAMPLE flip-flop 170 for producing logic 1 pulses successively in the SAM and $\overline{SAM}$ lines. $\overline{SAM}$ and X2 control a clocking circuit 172 having output clocking pulses 01, 02. This clocking circuit can include a variety of designs; however, one design is illustrated in the lower portion of FIG. 6. This representative logic circuit includes a flip-flop 174 controlled by AND gate 176 and NAND gate 178. These two gates receive X2 and $\overline{SAM}$ signals to control the output lines 01, 02.

The wave shapes created by the circuit in FIG. 2 are illustrated in FIG. 3. Oscillator lines OSC, $\overline{OSC}$ are oscillating at a frequency of 140 kilohertz; therefore, the X1, X2 pulses have a frequency of ¼ of that amount and occur each 28.6 $\mu$s. The output of divide-by-seven circuit 164 produces seven separate and distinct pulses, each of which occurs once each 200 $\mu$s. The chart of FIG. 6 shows that after a SAM pulse is received, the D1-D6 multiplexing pulses occur in succession. The lower two graphs illustrate the 01, 02 clocking pulses created by the clocking circuit 172 shown in FIG. 6. These pulses occur internally of chip 10 and are quite rapid. During the SAM pulse, most logic functions of the digital counting device A are performed. During the subsequent multiplexing pulses, various multiplexing functions are performed. As can be seen in FIG. 6, all functions are performed within about 200 $\mu$ s. When device A is used for timing, a 120 pps input at either terminals 80, 82 will produce a pulse approximately each 8.33 ms. Thus, the internal processing is completed and awaiting a new pulse a majority of the time. Consequently, many cycles of the circuit shown in FIG. 2 occur during and between each incoming pulse. When counting is being accomplished the digital counting device A, the pulses are usually more random. Obviously, they do not approach the rapidity of the internal oscillating circuits. For this reason, the internal circuits are stabilized between input pulses by a series of separate cycles of the internal processing oscillator and decoder circuit shown in FIG. 2 and having the wave shapes disclosed in FIG. 3.

GENERAL ENVIRONMENT OF THE INVENTION

Referring now to FIG. 4, there is shown, schematically, an electronic monitoring device M used for indicating when the stopping time of a brake in a power press exceeds a preselected stopping time. The environment of the present invention includes the general operating and braking system 200 of a standard power press having a drive system of the type generally including a drive shaft 202. To stop the press after a cycle or a desired time, an appropriate braking arrangement schematically represented as friction brake shoes 204, 206, is employed. Brakes are applied generally by springs when power is disconnected from the press or when the press is to be stopped. The stopping action generally involves removing power from the drive system and allowing application of brakes applied against an element secured onto or driven by the drive shaft 202. The spring application of the brakes is schematically illustrated by arrows 210, 212. The standard brake control 220 of the press is used to apply brakes 204, 206 when a stop signal has been received. A press power system 222, having input lines $L_1$, $L_2$ directs power to drive the drive system through a schematically represented line or system 224. As so far described, the system 200 shown in FIG. 4 is intended to be representative of a standard power press drive and braking arrangement which are well known in the art. When power is applied to the press, even though power through line or system 224 is disconnected during a braking cycle, line 226 is active and directs control power to monitor M. This causes an appropriate power supply 228 to develop reference voltages $V_{SS}$, $V_{DD}$ for operation of monitor M. In the first embodiment of the invention illustrated in FIG. 6, $V_{SS}$ is more positive than $V_{DD}$. In other words, $V_{SS}$ represents a high logic 1 and $V_{DD}$ represents a low logic 0 which can be considered as internal or chassis ground. The use of these two reference voltages is well known in the logic art and they are controlled to have a fixed voltage differential which power the LSI chip 10 of FIG. 1 and the circuitry of FIG. 6. As one input to monitor M of the first embodiment there is provided an arrangement for obtaining a series of input pulses having a time spacing indicative of the velocity of shaft 202 at any given moment. One arrangement for accomplishing this creation of input control pulses is schematically illustrated in FIG. 4 as equally spaced, circumferentially distributed exciting elements 332 on shaft 202. As is known, shaft 202 may be driven by the actual drive shaft of the press and need not be the actual drive shaft. In other words, a chain from the drive shaft of the press can be directed to a remote shaft which is rotated at the same speed as the drive shaft. This concept is best shown in FIG. 4A. The exciting elements 232 can be magnetically or inductively sensed by transducer 230 so that as each element passes the transducer a pulse is directed to an encoder 240. This encoder produces a shape pulse each time an exciting element passes the transducer. In this way, the output 242 of encoder 240 includes a series of uniform control pulses having spacing determined by the angular velocity of shaft 202, which corresponds to the speed of the member being stopped by brakes 210, 212. In the first preferred embodiment of the present invention, there are 720 elements 232 spaced around shaft 202 so that 720 pulses are created during each revolution of the shaft. This produces a more accurate control in the first preferred embodiment than a lesser number of pulses would produce. However, a lesser number of pulses is not outside the scope of the invention and are used in the second preferred embodiment. The first preferred embodiment of the present invention measures the stopping time of the press by sensing a stop signal through a cam arrangement which is schematically represented as stop signal cam 250 in FIG. 4. When cam 250 is in the normal condition, a voltage is created in line 258 as schematically illustrated in FIG. 4A. When cam 250 is in a second condition, during braking a switch is opened and voltage is removed from line 258. During an intermediate portion of a cycle, a checking or testing system is employed in the first preferred embodiment. This is controlled, in the preferred embodiment, by a check cam 252. Cams 250, 252 are controlled by the angular position of shaft 202 which control is schematically represented by dashed lines 254, 256. They produce a voltage signal on lines 258, 260, respectively, when the angular position of shaft 202 is in a selected position which will be explained later. Thus, voltage is applied to lines 258, 260 in response to the position of cams 250, 252 by the angular position of shaft 202. This concept is schematically illustrated in FIG. 4A wherein a chain 202a drives shaft 202b carrying a disc 202c and cams 250, 252. The cams are oriented to apply a voltage in lines 258, 260 in the sequence shown in FIG. 8. Basically, cam 250 is actuated when the press is to be stopped during each stroke. At the time cam 250 is actuated to remove voltage from line 258, press control 222 turns off power in line 224. This allows application of brakes 210, 212 as the voltage on line 258 indicates a stop signal. The stop signal is preferably operated by cam 250; however, it may be synchronized therewith by an appropriate circuit. Of course, other stop signal could be used in this illustrated embodiment of the invention.

GENERAL ARRANGEMENT OF THE FIRST PREFERRED EMBODIMENT

Referring now to FIG. 5, there is illustrated a block diagram showing certain general components of the first preferred embodiment of the present invention. An oscillator and frequency control circuit 270 produces either a 1 Kc or a 4 Kc output which is directed to the counter portion of brake monitor M. The particular frequency of the output is selected by the voltage condition of the check or test voltage produced by cam 252, as appearing in line 260. A voltage, i.e. logic 1, in line 260 is present except during the checking period. Then, a logic 0 appears in line 260. The output of the oscillator and frequency control circuit 270 determines the internal counting rate of the counter 20 of chip 10, which is employed in monitor M. The counting period is determined by the stop signal MS which is the signal or signal line controlled by the voltage on line 258 as determined by the stop signal cam 250. Also, a motion detector 272, to be explained in more detail later, controls the counting interval of chip 10 in monitor M.

In general operation, referring to FIGS. 4, 4A and 5, when cam 252 indicates a checking period during a press cycle, voltage is removed from line 260. This causes oscillator circuit 270 to apply a 4 Kc counting pulse to the counting chip 10 in monitor M. Thus, the chip is counted toward the number set in thumbwheel device 32 at four times the normal rate. If during the checking period, chip 10 of monitor M indicates an output, which it should, the counting chip 10 and monitor are properly operating. If there is no output during the checking period, then a fault is indicated and the press is deactivated until the monitor can be corrected or a possible defect in the press itself can be located. After the checking cycle indicates proper operation of monitor M, cam 250 indicates or initiates a stop signal and voltage is removed from the circuit controlled by this cam. Brakes 210, 212 are actuated and power is disconnected from line system 224. The brake now attempts to stop the power press. At that time, voltage in line 258 is removed and counter chip 10 starts its normal counting operation with a 1 Kc counting pulse from circuit 270. If the press is stopped within a proper time after cam 250 indicates or initiates a stop signal, monitor M will not produce an output before the motion detector 272 indicates that the press has been stopped. In other words, chip 10 does not count to the set number in thumbwheel device 32 before the press is actually stopped which is indicated by the motion detector 272. This is normal operation and allows continued cycling of the press for continued operation. If the press brake system deteriorates, a longer time is required to brake the power press drive system. When this longer time allows the chip 10 to count to the number within thumbwheel device 32 before motion has been stopped, as indicated by detector 272, an output is created by chip 10 of monitor M. The output deactivates the power press and prevents further operation. In addition, it produces an output signal indicating that the monitor has indicated a deterioration of the braking action beyond a level which has been determined to be satisfactory. In this manner, the brake can be repaired or replaced when it deteriorates beyond a selected condition. There is no need to replace the brake periodically. In addition, there is no possibility that a rapidly deteriorating brake will not be detected prior to an unsafe condition being created.

WIRING AND LOGIC DIAGRAM OF THE FIRST PREFERRED EMBODIMENT

Referring now to FIG. 6 including FIGS. 6A, 6B, a wiring diagram and logic diagram is set forth showing the first preferred embodiment of the present invention. Each of the various components of this diagram will be discussed separately with their intended operation to show the total operation of the preferred embodiment. Components shown in FIG. 1 retain their same number designations.

Referring first to the check input 280 for monitor M, alternating current will flow through line 260 until the check cam 252 is actuated by shifting from the lobe and opening the switch schematically illustrated in FIG. 4A. At that time, no voltage flows through line 260. This line, as shown in FIG. 6, includes a current limiting resistor 282 and a neon tube 284. Thus, during the checking cycle, tube 284 is extinguished. During the other portions of the press cycle, the neon tube 284 is energized by the alternating current flowing through line 260. Neon tube 284 provides an optical coupling with an adjustable photosensitive resistive element 286 which has a lower resistance when neon tube 284 is energized. Element 286 may be adjusted to compensate for variations in the operating characteristics of this coupling. A voltage dividing resistor 288 provides a circuit between the high $V_{SS}$ line and the low $V_{DD}$ line to control a timer chip 290 having an input 292 and an output 294. Chip 290 is a standard timer chip of the type which will toggle to a logic 0 in output 294 when the voltage at input 292 is approximately ⅔ $V_{SS}$ or greater. In a like manner, when the voltage on input 292 is ⅓ or less of the $V_{SS}$ voltage, a logic 1 appears in output line 294. The ⅔ and ⅓ thresh-hold terminals of timer 290 are marked and both connected to line 292. During normal operation, neon tube 284 is energized which reduces the resistance of element 286. This brings input 292 toward the low $V_{DD}$ line. Consequently, under normal conditions output 294 is a logic 1. During the checking cycle of the checking time period, cam 252 removes the voltage from line 260. This extinguishes neon tube 284 and increases the resistance of element 286. Thus, input 292 of timer 290 shifts toward $V_{SS}$. By selecting the resistances of element 286 and resistor 288, input 292 is greater than ⅔ of voltage $V_{SS}$ and output 294 is at a logic 0. Thus, during the checking period in a press cycle, a logic 0 appears in output 294 of timer 290.

A similar circuit is employed for the stop signal or main switch MS in monitor M. Circuit 300 is responsive to the voltage in line 258. In a manner similar to line 260, line 258 includes a current limiting resistor 302 and a neon tube 304. An adjustable photosensitive resistive element 306 is optically coupled with neon tube 304 and coacts with a voltage dividing resistor 308 to control the operation of a second timer chip 310 having input 312 and output 314. The operaton of timer 310 is the same as the operation of timer 290. Thus, until a stop signal or MS signal is received by monitor M, an alternating current flows through line 258. This energizes neon tube 304 and holds input 312 to a low level. This produces a logic 1 in output 314. When the press is to be braked, a stop signal is received which corresponds to a removal of voltage from line 258. This voltage is removed until the end of the stopping or braking sequence. At that time, the resistance of element 306 increases to force input 312 toward high control voltage $V_{SS}$. This produces a logic 0 in line 314. Thus, a logic 0 appears in line 314 when the power press is in the braking portion or cycle of the stroke.

In summary, as shown in FIG. 8, line 294 shifts from a logic 1 to a logic 0 during the central portion of the stroke of a power press. Line 314 shifts from a logic 1 to a logic 0 during the braking cycle which is initiated with and continued by a stop signal controlled by cam 250 or created at the time cam 250 drops out.

To control the counting interval of chip 10 toward the counts set in thumbwheel device 32, there is provided a logic NAND gate 320 controlled by lines 294, 314. Output 322 of gate 320 controls the bias on diode 324 in a circuit including a pull up resistor 326 connected to the $V_{SS}$ line and a current limiting resistor 328 controlling the RESET line 329 of LSI chip 10. When a logic 1 appears in output 322, line 329 shifts to a logic 1 under the control of resistor 326. This releases the internal reset of chip 10 to allow counting. A logic 0 in line 322 shifts line 329 to a logic 0 which is the internal reset condition for chip 10. Consequently, whenever a logic 1 appears in line 322 and in line 329 to release counter 20, the counter starts counting. The counting cycle is terminated when a logic 0 appears in line 329. This feature is illustrated in FIG. 8. Thus, when a logic 0 appears in either line 294 or line 314, or both lines, a logic 1 appears in line 329 and counter 20 is counting. When a logic 1 appears in both lines 294 and 314, a logic 0 appears in output 329 which resets the internal counter and stops the counting process or interval. It is apparent that only during the checking period and the braking cycle of the press stoke are the input conditions of gate 320 logically arranged to allow counting. In all other portions of the stroke of the press, a logic 1 appears in both lines 294, 314 to hold the reset signal on chip 10 and inhibit counting thereby.

Referring now to the oscillator and frequency control or select circuit 270, this circuit includes a standard 4 Kc oscillator 330 with control resistor 332, 334 and control capacitor 336. Oscillator 330 has an output 338 which receives a continuous, uniform, time base train of pulses having a frequency of 4 Kc. Two divided by two circuits 340, 342 are formed by standard D-type flip-flops to produce a 1 Kc train of pulses in line 344. This train of pulses has a time base frequency which is substantially less than the frequency of the pulses in line 338. The relative difference between the frequencies of the two lines is not critical although it must be sufficient to produce an output of monitor M during the checking cycle, which is only a small portion of the total stroke of the power press. As will be explained later, during the checking cycle the high frequency on line 338 is passed into counter 20 of chip 10 so that the counting sequence can be cycled in a shorter time span. By the ratio of frequencies indicated in the preferred embodiment, this compacting feature is a factor of four. Oscillator and frequency control select circuit 270 includes a frequency selector circuit 350 for passing either the high frequency or low frequency time base pulses into the counter of chip 10. A variety of gating arrangements could be used for this purpose; however, in the illustrated embodiment, selector circuit 350 includes a NAND gate 352 having an output 354 and an input 294, which is the output of checking timer 290. Output 354 is connected to NAND gate 356 having an output 358, which carries the 4 Kc pulses when gate 356 is unlatched by the logic of line 354. Output 358 passes the 4 Kc pulses to a pass NAND gate 360 having an output 362 which receives either the 1 Kc pulses or the 4 Kc pulses, according to the logic condition of circuit 350. This circuit also includes NAND gate 364 having inputs 294, 344 and an output 366 connected to the pass gate 360. The operation of selector circuit 350 is quite apparent. During the checking cycle, output 294 is a logic 0. This produces a logic 1 in line 354. Thus, gate 356 passes the 4 Kc pulses in line 338 to output 358. Line 294 also inhibits gate 364 to produce a logic 1 in line 366 and blocks passage of the 1 Kc pulses from line 344. With a logic 1 at input 366, pass gate 360 passes the 4 Kc pulses in output 358 of gate 356. Thus, during the checking cycle line 362 carries 4 Kc counting pulses. At all other times, line 262 carries 1 Kc pulses. A logic 1 in line 294 activates gate 364 to allow the 1 Kc pulses in line 344 to appear in line 366. At the same time, a logic 1 at the two inputs of gate 352 produces a logic 0 in line 354. This inhibits gate 356 to produce a continuous logic 1 in line 358. In this manner, pass gate 360 passes the 1 Kc pulses and inhibits the 4 Kc pulses.

As previously mentioned, two of the basic inputs to monitor M are the check voltage control and the stop or MS voltage control. The third monitor input is the system for creating control pulses which have a time spacing indicative of the rotary velocity, at any given time, of the drive system or mechanism being monitored. As shown in FIG. 4, an encoder 240 has an output line 242 which produces 720 pulses per revolution of a control shaft or the drive shaft. In FIG. 6, this control pulse train generating circuit includes an optical coupling 380 having a light emitting element 382, such as an LED, and a light responsive conductive element 384. When a pulse is received in line 242, LED element is lighted to make transistor element 384 conductive. The output of coupling 380 is line 386. Upon receipt of each pulse, line 386 shifts to a logic 1. This logic 1 is controlled by the control voltage $V_{SS}$. The logic on the control pulse generating circuit output 386 controls motion detect circuit 272 having an output 390 which is a logic 0 when the spacing between successive pulses in line 242 is great enough to indicate substantially no motion of the drive system. Thus, a logic 0 appears in output line 390 when the spacing between successive pulses is beyond a preset time value. At all other times, when the spacing between successive pulses in line 242 is below a set value indicating motion of the drive system, the output on line 390 is a logic 1. Various circuits could be used for converting the control pulses in line 386 to a logic 0 or a logic 1 condition using the parameters mentioned above. One such circuit is illustrated in FIG. 6 and includes a timer 400 having an input 402 and an output 404. The input control circuit 410 includes a transistor 412, a base resistor 414, a ground resistor 416, an emitter resistor 418 and a voltage divider circuit including adjustable resistor 420, fixed resistor 422 and control capacitor 424. Input control circuit 410 controls the logic on ⅔ input 402 of timer 400 which operates somewhat similarly to the timers 290, 310. A high voltage above about ⅔ of $V_{SS}$ on input 402 toggles a logic 0 at output 404. A low voltage on input 402 does not affect output 404. Under normal operating conditions, shaft 202 is in motion and fairly closely spaced pulses are received in line 386. Upon each pulse, transistor 412 is forward biased and discharges capacitor 424 through resistor 418. Thus, input 402 is at a low logic and has no effect upon the normal logic 1 in output 404. When a pulse disappears from line 386, transistor 412 is non-conductive and capacitor 424 starts charging toward a level sufficient to toggle the logic of line 404 from a logic 1 to a logic 0. This charging voltage is determined by resistors 420, 422. During normal operation, before the logic of line 404 can shift, another pulse appears in line 386. This again discharges capacitor 424 and holds input 402 to a low level sufficient to maintain a logic 1 in output 404. This continued discharging of capacitor 424 occurs as long as there is motion in the drive system, as indicated at the lower dashed line of FIG. 7. When the motion of the drive system has stopped, pulses in line 386 stop. This allows capacitor 424 to charge a sufficient value to put a high voltage on input 402 which shifts the logic of line 404 to a logic 0. This indicates no motion which is a condition indicative of very slight motion as indicated by the motion dashed line of FIG. 7. A certain spacing between successive pulses indicates that the power press for all practical purposes is stopped. By providing 720 pulses per revolution (720 ppr), a more accurate indication can be made of the actual stopping or braking cycle, since the pulses are received for each 0.5° of rotation. If a 0.5° rotation is not received within a preset time, there is all likelihood that the motion of the drive system has been terminated. Thus, the logic on output 404 indicates whether the shaft or drive mechanism is in motion or not.

Detector circuit 272 also includes resistors 426, 428 and capacitor 430 to control the ⅓ terminal of timer 400. When the voltage on this terminal is less than about ⅓ of $V_{SS}$, timer 400 is toggled to produce a logic 1 on line 404. Line 432 is directed to the input of a set NAND gate 434 having output 436 for setting the remainder of the motion detect circuit 272 in a manner to be explained later. This circuit also includes a NAND gate 440 having an input 442 which is connected to output line 390 of the detect circuit and input connected to line 404 which was previously explained. The output of gate 440 is line 444 which is connected to the input of a NAND gate 450 controlled by output 436 of gate 434.

When a logic 1 is first created in line 386 by a control pulse, the ⅓ terminal is held above its toggle voltage by capacitor 430. When the pulse terminates, capacitor 430 discharges through resistor 416 and a logic 1 is created in line 404 and remains until timer 400 is toggled by line 402. At the next pulse, line 432 shifts to a logic 1 which concurs with the logic 1 of line 404. In this condition, a logic 0 appears in line 436. This produces a logic 1 in output line 390 of the motion detect circuit. This logic 1 is directed to line 442 of gate 440 which produces a logic 0 in line 444. This produces a holding logic for output gate 450. Consequently, during normal operation 404 remains at a logic 1 and fluctuations in line 432 have no effect upon gate 450. A logic 1 remains in line 390 as long as there is sufficient close spacing between successive pulses in line 386 to hold a logic 1 in output 404. The logic on line 390 could be used in various manners to stop the counting of counter 20 in chip 10 when motion is stopped during the braking operation. An arrangement for accomplishing this objective is shown in FIG. 6. A NAND gate 460 includes inputs 314, 390 and an output 462 connected to NAND gate 470. Gate 470 has a second input 472 and an output 474. Output 474 is directed to the input of a third NAND gate 476 which controls the input 472 of gate 470. Output 474 is directed to the counting gate 480 having an output 482 connected to the UP counting terminal of chip 10. During normal operating conditions, a logic 1 appears at output 390 of motion detector 272 because there is motion of the shaft or drive system. Also, a logic 1 appears in line 314 since there has been no stop signal. This directs a logic 1 to the inputs of gate 460. A logic 0 appears in line 462 to create a logic 1 in line 474. This logic 1 combines again with the logic 1 of output line 390 to produce a logic 0 at the second input 472 of gate 470. This is a holding input. Thus, a logic 1 normally appears in line 474 to open the counting gate 480. For that reason, pulses from line 362 pass to the UP counting terminal through line 482 as shown in FIG. 8. After a braking cycle, the next stroke of the press again provides a logic 1 on both lines 404, 432 to set line 390 to a logic 1 for motion detection in the stroke.

When the checking cycle is established by shifting line 294 to a logic 0, gate 480 passes the 4 Kc counting pulses. When the braking signal is provided, a logic 0 appears in line 314. This produces a logic 1 in line 462; however, this has no effect upon gate 470 because of the logic 0 in line 472. Thus, when the brakes are first applied and a MS or stop signal is created, the logic on line 474 does not change. The counting pulses are continued through line 480. Of course, these counting pulses are 1 Kc since the logic on line 294 is a logic 1. Thus, during the braking cycle pulses are directed through line 482 to chip 10 by gate 480. This is continued until there is sufficient spacing between successive pulses in line 242 to indicate that motion has stopped. If motion is stopped, output 404 shifts to a logic 0. This produces a logic 0 at inputs of gates 434, 440. A logic 1 thus appears in lines 436, 444. Consequently, the output 390 of the detector circuit now shifts to a logic 0 representing the stopped condition of the drive system. If another pulse is received after the pulse spacing indicates that motion is essentially stopped, line 402 shifts low without affecting line 404. When this pulse disappears, output 404 shifts high by operation of the ⅓ terminal. By this time, the logic on line 432 is low so that two logic ones do not appear on gate 434 to start counting again. Since the motion is below the no motion level 404 will again shift low before the next possible pulse. Thus, when no motion is detected, there is no reset of line 390. If line 402 controlled both the ⅔ and ⅓ terminals, counting could be restarted after the threshhold motion is reached.

Figure 10:
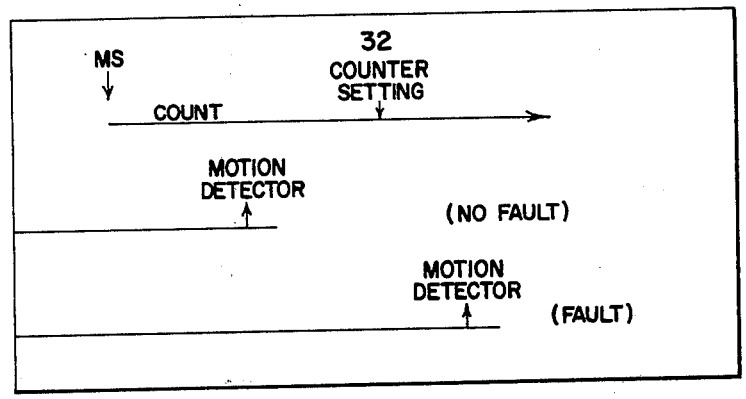
FIG. 10 is a chart illustrating operating characteristics of the first preferred embodiment of the invention.

When line 390 shifts to a logic 0, gate 476 is shifted to produce a logic 1 in input 472 of gate 470. This combines with the logic 1 of line 462 because of a receipt of a stop signal (MS) to produce a logic 0 in line 474. Gate 480 is inhibited and no further counting pulses are directed through this gate to the UP count line 482. Consequently, when motion is stopped, counting is stopped during the braking cycle or portion of a press stroke. If the counting is stopped before counter 20 counts up to the set count in thumbwheel device 32, there is no output pulse from chip 10. This is schematically illustrated in FIG. 10. If motion detector output 390 shifts to a logic 0 before counter 20 reaches the counter setting, there is no pulse indicating output. Since gate 480 will allow counting continuous until there is no motion indicated by circuit 272, if counter 20 reaches the set count number before no motion is realized, there will be a fault indicating output from chip 10. Also, the counter will continue to count until a stop signal is given to record in visual display 92 the time required to stop the press. This will give information on the amount of deterioration. This pulse would indicate that it requires an excessive amount of time to stop the power press drive system after a stop signal MS has been created. This is indicative of the deterioration of the braking function and requires maintenance of the power press brake system to overcome this condition before the press can be again operated with the monitor attached.

As one output circuit, the illustrated embodiment includes a motion indicating circuit 490 having a relay coil 492, for operating a switch 494. Indicator light 496 is lighted when switch 494 is closed by energizing coil 492. To energize coil 492, there is provided a transistor 500 having a base 502 connected through a base resistor 504 to line 474. As long as there is motion of the power drive system, a logic 1 appears in line 474. This forward biases transistor 500 to energize coil 492 and close switch 494. Thus, indicator light 496 is lighted as long as there is motion of the drive system.

As previously mentioned, especially with reference to FIG. 10, an output signal is created when chip 10 counts to the setting of thumbwheel 32 before motion has been stopped. This pulse appears in the − output 510 of chip 10 and, as shown in FIG. 6 is a − or logic 0 pulse. In FIG. 1, the pulse is indicated as a + or logic 1 pulse; however, this distinction is unimportant. The + pulse of FIG. 1 is based upon the negative logic internally of chip 10 which means the pulse is going more negative which is a high logic internally of chip 10. Since the circuitry shown in FIG. 6 is based upon positive logic, the use of a high negative output shown in FIG. 1 is illustrated in FIG. 6 as a negative or logic 0 output pulse. The output circuit 520 processes the existence of an output pulse in line 510. This output circuit could take a variety of forms; however, in the illustrated embodiment, it includes a transistor 524 with a base resistor 525 connected to output line 510. A relay coil 526 is controlled by transistor 524 and includes a protective diode 528 and a voltage developing resistor 530. Coil 526 operates relay switch 532 which turns off triac circuit 540 when switch 532 is closed by existence of an output pulse in line 510. By separate circuit or a circuit combined with triac circuit 540 an indicator light 542 can be lighted to indicate that there has been a fault detection by a pulse in line 510. If this output pulse occurs during the braking cycle, it indicates that the time necessary to bring the drive system to no motion exceeds the time set into thumbwheel device 32. An output pulse before an MS or stop signal is a testing pulse and should be ignored; therefore, the triac circuit will not turn off when an output pulse is created in line 510, unless the braking cycle has started. Indeed, an output pulse during testing is needed to continue operation of the press for a successive stroke.

Figure 9:
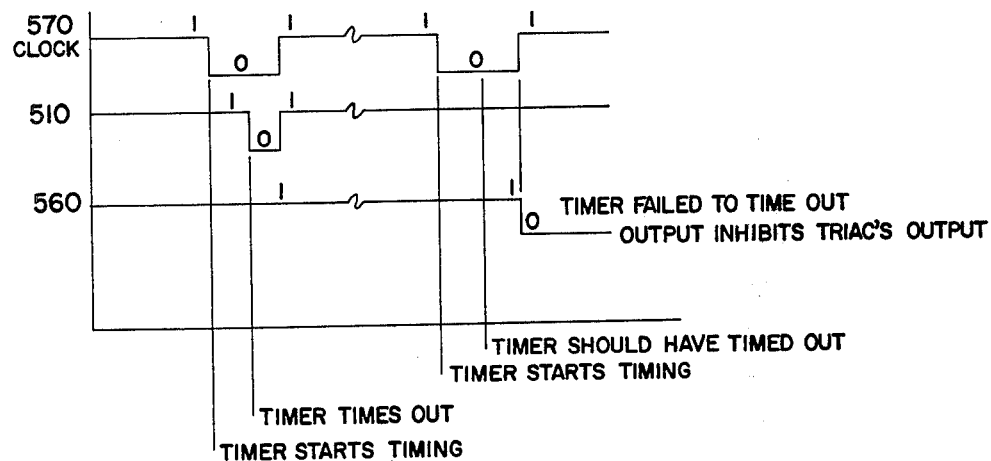
FIG. 9 is a logic chart showing the operating characteristics of the internal checking or testing circuit used in the embodiment of the invention illustrated in FIG. 6.

As previously mentioned, during a checking cycle which occurs during the stroke of the press and for a short time, an output pulse in line 510 must be created to allow continued operation of the press. This is to assure that the counting chip is operating and that the monitor is processing information accurately. To process the output pulse in line 510 during the checking cycle, there is provided a checking circuit flip-flop 550 which is a somewhat standard D-type flip-flop. The D terminal line 552 is the output of an OR gate 554 having inputs 556 connected to the output line 510 and 558 connected to the Q terminal of flip-flop 550. The $\overline{Q}$ terminal is connected to line 560 which is directed through a current limiting resistor 562 to the base of previously described transistor 524. The clocking terminal C of flip-flop 550 is connected to line 570, which has the same logic as output 294 of the checking timer 290. The operation of the flip-flop 550 is schematically illustrated in FIG. 9. During the checking cycle or period, line 570, which is connected to output 294 of timer 290, shifts to a logic 0. This causes counter 20 of chip 10 to count at four times the normal rate by opening gate 356. This prepares the flip-flop for subsequent clocking when output 294 shifts to a logic 1. An output appears in line 510 if the circuitry of monitor M is working properly. This output occurs before expiration of the checking period and is removed by resetting chip 10 when line 570 clocks flip-flop 550. Thus, under normal conditions, an output will appear in line 510. This will produce a logic 0 in line 552. Thus, when the checking cycle terminates and line 570 shifts to a logic 1 to clock flip-flop 550, a logic 0 is clocked to the Q terminal. This retains the normal logic 1 at the $\overline{Q}$ terminal to reverse bias transistor 524. The width of the output pulse 510 is sufficiently large to retain this pulse during the checking cycle. A zero is retained at the Q terminal which is directed through line 558 to the other input of OR gate 554.

If there is a defect in the counter so that no output signal is created in line 510 during the checking period, a logic 1 is held on line 556. This produces a logic 1 in line 552 at the D terminal of flip-flop 550. Thus, when the logic on line 570 shifts back to a logic 1 to clock flip-flop 550, a logic 1 is shifted to the Q terminal. This produces a logic 0 at the $\overline{Q}$ terminal to forward bias transistor 524 and deactivate the power press by relay coil 526 after the checking cycle is terminated. Thus, transistor 524 will shut down the power press by line 560 when no output pulse is received during a checking cycle. Line 510 will shut down the press if a pulse is received during a braking cycle. To do this, various external circuits, which are not involved in the present invention, could be used. This can be done by a release line 570a which is a logic 0 during the checking cycle. When release line 570a is a logic 0, transistor 524 does not turn off the triac circuit 540. When line 570a is a logic 1, circuit 540 is released for control by transistor 524. Thus, if after the checking cycle, line 560 is at a logic 0 because no time out signal was created, the triac circuit is shut down. If the press has been deactivated in this manner, a logic 1 appears in line 558. This holds line 552 to a logic 1 and prevents flip-flop 550 from releasing transistor 524.

In some power presses, multiple strokes may be experienced before the press is to be stopped. In this instance, each stroke may include a checking period. If any one of these periods produces a fault signal in line 560, a successive continued rotation of the press will not release transistor 524 even though the next checking period produces a normal operation. To do this, many holding circuits are available. In FIG. 6, a flip-flop 564 is clocked through inverter 566 by a logic 0 in line 560 to produce a logic 1 at the Q terminal. This produces a logic 1 at hold circuit 568 which prevents the next cycle of the press. The flip-flop 564 can be substituted for release line 570. With a logic 1 held in line 558 flip-flop 564 can not be released except by manual reset or reset in a start up sequence.

The starting cycle for monitor M is illustrated in FIG. 6 as starting circuit 580 which is one of several types that could be used. In this circuit, transistors 582, 584 are combined with current limiting resistor 586 and a voltage divider including resistors 590, 592 and Zener diode 594. Chip 10 should be reset at the start up of the press when power is applied through lines $V_{SS}$, $V_{DD}$ to monitor M. Circuit 580 produces a negative reset pulse on line 329 to assure that the chip starts in a reset condition. Zener diode 594 has a voltage break down of approximately 9.1 volts. Thus, when power is first applied, $V_{SS}$ is low. Transistor 582 is non-conductive until the voltage $V_{SS}$ builds up to approximately 9.1 volts. With transistor 582 non-conductive transistor 584 is conductive. This grounds line 329 to create a chip reset condition to place the logic of the chip into the proper state for operation. This reset logic 0 is retained until the $V_{SS}$ exceeds approximately 9.1 volts. At that time, transistor 582 is forward biased to reverse bias transistor 584. This then removes the reset signal on line 329. During initial chip reset at the start of a shift, the check circuit flip-flop 550 is also reset by a circuit 600. This circuit includes a pull up resistor 602, a blocking diode 604 and an inverter 606 in line 608. When logic 0 is applied to line 329 by conduction transistor 584, a logic 1 is applied to line 608 which is the reset terminal of flip-flop 550. This resets the flip-flop. When transistor 584 becomes non-conductive, the $V_{SS}$ control voltage is applied to inverter 606 through resistor 602. This applies a logic 1 to the inverter to remove the logic 1 from the reset terminal of flip-flop 550. In this manner, at the start of each operating period for monitor M, flip-flop 550 is reset with a logic 0 at the Q terminal. Other arrangements could be done for accomplishing this purpose during the initial starting cycle for the monitor.

For each stroke of the power press, the velocity of the drive system, especially the drive shaft or a shaft driven thereby, follows basically the line in the graph of FIG. 7. At intermediate portion cam 252 produces a checking gap or low voltage. At that time, gate 320 releases the reset line 329 to allow counting at a relatively high frequency, i.e. 4 Kc. If the circuit is operating properly, an output pulse is created in line 510 to maintain the condition of flip-flop 550. If there is no output pulse in line 510, then the flip-flop turns off the power system and holds the power system of the press off until the difficulties are corrected. In the alternative, the next press operating cycle or stroke is inhibited. An output pulse in line 510 during the checking or testing cycle does not turn the press off. This may be controlled by external circuitry. When the stop signal is created indicating that the brakes are to be applied and power is to be removed from the press drive system, chip 10 starts to count toward the count set into thumbwheel device 32. If this is reached before circuit 272 indicates no motion, a brake deterioration fault is indicated. Counter 20 continues to count until no motion is indicated by 272. Thus, the reading on the visual display device 92, shown in FIG. 6, is the time or counts necessary for stopping the power press. In this manner, during each stopping cycle an operator knows exactly the operating characteristics of the press. Even if the press indicates a fault and counts beyond the set count of device 32, an operator knows the extent to which the set count has been exceeded. By using this visual display concept, accurate monitoring of each braking cycle is possible. In the next stroke, the MS voltage is again applied and the counter is reset to zero for the next counting interval in the next stroke of the press. Chip 10 is controlled by lines M1, M2, M3 which are floating so that the chip is in the counting mode. Of course, when in this counting mode, the thumbwheel device 32 setting is indicative of time because the counting pulses have a known time base frequency. The READ DIRECT line is also floating to allow chip 10 to operate in the mode wherein counter 20 counts from zero to a set number in the memory unit of chip 10.

Each of the various circuits has been described in connection with their total function in monitor M. This, taken together with the general description of the monitor, clearly indicates the operating characteristics and advavantages of the first preferred embodiment of the present invention.

SECOND EMBODIMENT

Figure 13:
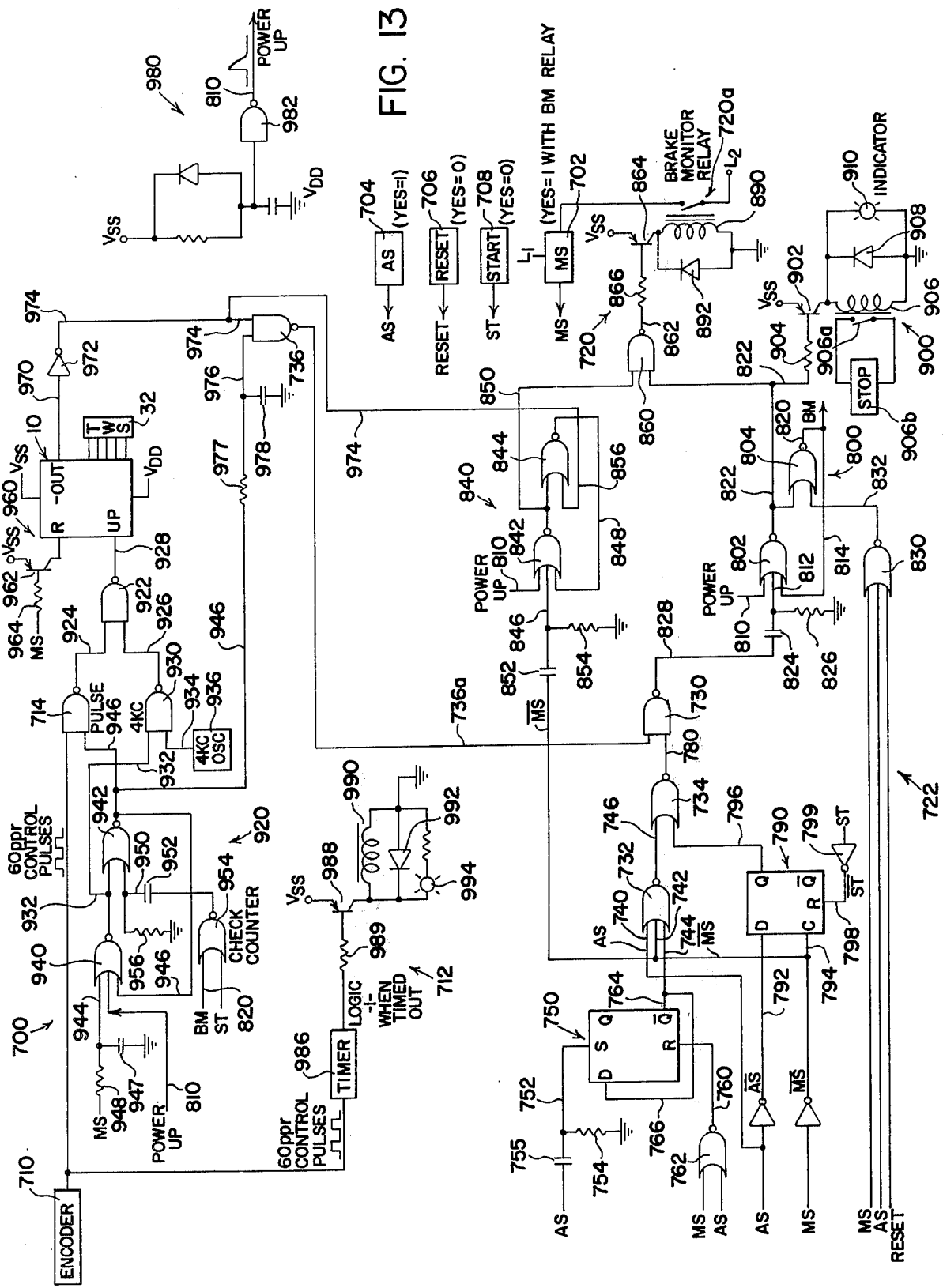
FIG. 13 is a detailed wiring and logic diagram illustrating schematically the second preferred embodiment as presented in FIG. 11.

Referring now to FIGS. 11–13, a second embodiment of the invention is illustrated. In this embodiment, the electronic monitoring device 700 is schematically illustrated in FIG. 11. MS cam 702 performs basically the same type function as the previously mentioned MS cam 250. When this cam is deactuated or opened, logic 0 appears in the MS line. This defines the braking cycle of the power press and occurs at or concurrently with the creation of the stop signal. This is schematically illustrated in FIG. 12. Auxiliary cam 704 is also used in monitor 700. This cam operates as a check on the operation of the main stop cam MS. As is apparent in FIG. 12, the auxiliary stop signal or AS signal determined by cam 704, occurs after the main stop MS and continues a slight distance a beyond the creation of a stop signal which drops the MS line to a logic 0. The logic of AS line controlled by cam 704 is the same as the MS line logic after cam 704 is dropped. When the cam 704 is actuated, voltage is applied to the AS line or circuit and a logic 1 appears. When cam 704 is not actuated during a portion of a stroke, a logic 0 appears in the AS line. Thus, if the auxiliary stop AS is a logic 0 while the main stop MS is at a logic 1, except at the start of a stoke, there is a fault in the main stop MS. This is one of the basic operations of the auxiliary stop cam and the AS line controlled thereby. Of course, main stop cam 702 and the auxiliary stop cam 704 are operated by the drive shaft of the power press in accordance with the previously described monitor M. In FIG. 4A, one arrangement for driving these operating cams is illustrated. Two other input signals to monitor 700 are the RESET signal 706 and the start signal (ST) 708. The RESET signal is at a logic 0 at the start of a shift to reset certain internal logic of monitor 700. The start signal 708 is shifted to a logic 0 at the start of each press stroke, as indicated by FIG. 12. The indicated start (ST) portion in FIG. 12 labeled START is a logic 0 for a purpose to be explained later. The start signal (ST) is created by an appropriate switch or switches and occurs at the beginning of each press stroke. It must have a sufficient length to check the internal counter 20 and the operation of monitor 700. In practice, the length of the logic 0 of start signal (ST) is at least 50 ms. This start signal must disappear and become a logic 1 before the 360° portion on the cycle to prepare the starting circuit for the next stroke. An encoder 710 is similar to encoder 240 in that it creates pulses determined by the speed of the press drive shaft or an auxiliary element, such as 202c shown in FIG. 4A. In this second embodiment, a detecting element 232 appears every 6° on wheel 202c to produce 60 pulses for every revolution of the press drive shaft. Thus, this embodiment of the invention operates an encoder 570 for creating 60 ppr which controls both a motion detect circuit 712 and a passing gate 714 which is opened when a logic 0 appears in the MS line. The MS line can either control the gate 714 or the reset of chip 10 including counter 20. In accordance with this embodiment, a brake monitor relay 720 is energized as long as the brake has not deteriorated beyond a position which will allow more than a certain fixed angular rotation after the stop signal occurring at the beginning of a logic 0 in the MS line. The monitor relay 720 is controlled by logic 722 which appears in more detail in FIG. 13 and includes a contact 720a which controls the voltage to the MS cam circuit. With contact 720a open when relay 720 is not energized, voltage, i.e. a logic 1, can not be supplied to the MS line even if the MS cam is in the actuated condition.

In monitor 700, during the logic 0 condition of start circuit 708, counter 20 is checked to make sure that it is functioning properly. This is done in a manner similar to the first embodiment of the invention wherein a 4 Kc frequency is applied to the counter to assure that the counter will count out to produce an output signal when a certain selected number of counts has been received and counted. After the start sequence, brake monitor relay 720 is energized to close contact 720a shown in FIG. 13 and apply a voltage to the circuit controlled by main stop cam 702. In this manner a logic 1 can be produced by cam 702 in the MS line. This inhibits counting of counter 20 by placing it in the reset condition. At the stop signal when the main stop cam causes a shift of the MS line to a logic 0, counter 20 starts counting the control pulses from encoder 710. In this embodiment, counter 20 counts the control pulses as they pass through gate 714. If the preselected number of control pulses is counted, this indicates a certain angular displacement of the press shaft after the stop signal has been given. Thus, the number of control pulses created indicates the angular displacement after the stop signal. If the displacement is too great, the selected number of pulses of device 32 is counted and the brake monitor relay is deenergized indicating a fault. If more accuracy is required in this particular embodiment of the invention, a greater number of elements 232 can be applied around shaft 202 or control wheel 202c.

Referring now to FIG. 13, monitor 700 is disclosed in detail. The logic of the MS line is controlled by cam 702 and contact 720a of brake monitor 720. The logic on line AS is controlled by cam 704. At the beginning of a shift when the press is first activated, a logic 0 appears in the RESET line controlled by a circuit, indicated as 706 in FIGS. 11 and 13. At the beginning of each stroke, a logic 0 appears in the ST or START line controlled by a circuit represented as 708 in FIGS. 11 and 13. This control may be one or more pushbuttons as are generally used on a power press.

Monitor 700 includes a fault detecting NAND gate 730 which determines a fault in the AS checking circuit and a fault determined by excessive pulses during the braking cycle of the press. Before discussing the brake created fault system, the control of gate 730 by the MS and AS lines will be described. NOR gates 732, 734 control the fault indicating NAND gate 730. Referring first to NOR gate 732, this gate includes inputs 740 (AS), 742 ($\overline{MS}$) and 744 and an output 746. The logic of input 744 is controlled by the AS control flip-flops 750 having a D-type structure. The S terminal is connected to input 752 connected to chassis ground by resistor 754 and to the AS line by capacitor 755. Reset terminal R is controlled by the logic on line 760 which is the output of steering NOR gate 762 having inputs MS, AS. The $\overline{Q}$ output 764 is connected to input line 744 and also, by a feed back line 766, to the D terminal. The output 780 of NOR gate 734 is normally a logic 1 indicating that the logic 0 is normally in line 746. A fault is indicated by a logic 1 in line 746 which can be produced by a logic 0 in the MS and AS lines and in input 744.

Under normal operation of flip-flop 750, the MS, AS lines at the start of a press cycle are logic 0 because, as shown in FIG. 12, the AS cam is not yet operative to produce a logic 1 in the AS line and because contact 720a of brake monitor relay 720, as shown in FIG. 13, is open until after the brake monitor is energized during start of the cycle. With a logic 0 appearing in lines MS, AS, a logic 1 appears in flip-flop reset line 760. This resets flip-flop 750 to a logic 0 producing a logic 1 in the $\overline{Q}$ output 764. Thus, a logic 1 appears in line 744 to produce a logic 0 in output 746 of gate 732. Thus, no fault is indicated. Thereafter, the brake monitor 720 is energized, in a manner to be described later, which applies a voltage through contact 720a to the MS cam controlled circuit, which has been previously closed, as indicated in FIG. 12. This produces a logic 1 in the MS line and a logic 0 in reset line 760. The resetting of the flip-flop 750 is completed at the start of the press stroke and a logic 1 appears in feed back line 766. When the MS line is energized to produce a logic 1, the logic 0 appears on $\overline{MS}$ input 742. Thus, before the AS line is energized by the AS cam 704, to produce a logic 1 in line 740, a logic 0 appears on both lines 740, 742. This releases gate 732 except for the logic 1 in line 744. As soon as the AS cam is energized to produce a logic 1 in the AS line, a logic 1 appears in input 740. At the same time, capacitor 755 is subjected to a logic 1. This ultimately creates a logic 1 in line 752 which sets flip-flop 750 to a logic 1. Thus, a logic 0 appears at the $\overline{Q}$ terminal 764 and in line 744. The capacitor 755 assures that a logic 1 appears in the input 740 before input 744 is shifted to a logic 0. Thus, the AS line now holds output 746 to a logic 0. Flip-flop 750 and gate 732 are now conditioned to monitor the main stop cam 702 controlling the logic of the MS line. If the AS cam is dropped out at the point shown in FIG. 12, line AS shifts to a logic 0. This should happen after the MS line shifts to a logic 0 to place a logic 1 in line 742. If the AS cam drops and the MS line is still a logic 1, all inputs to gate 732 are at logic 0. This produces a logic 1 in output 746 to produce a logic 0 in fault detecting output 780. If the MS cam and its circuit are operating properly, this will not happen in a press stroke. The MS line will shift to a logic 0 before the AS cam is dropped. In this normal operation, the AS line input 740 is a logic 1 when the MS line shifts to a logic 0 to convert the logic in line 742 to a logic 1. This holds the output of gate 732 to a logic 0, irrespective of the logic in input 740 or input 744. Thus, if main stop cam MS is dropped before the auxiliary checking cam AS, no fault is indicated in line 780.

The next possible fault is the failure of the circuit including the voltage controlled by the AS cam 704. When such a fault occurs, the AS line remains disconnected and thus at a logic 0. This type of fault is detected and monitored by the broken AS flip-flop 790 including a D line 792 having the $\overline{AS}$ logic and a clocking terminal 794 having the $\overline{MS}$ logic. Output 796 is connected to the Q terminal of flip-flop 790. The reset terminal R is connected by line 798 to an inverter 799 controlled by the ST start logic. At the beginning of the cycle, the ST start logic is a logic 0. This produces a logic 1 in line 798 to reset flip-flop 790 to a non-fault logic 0 in output 796. After the starting sequence, which must be terminated before the stop signal to allow for this type reset of flip-flop 790, MS is a logic 1. Thus, a logic 0 appears in clocking line 794. Under normal operating conditions, the AS line is first a logic 0 and then shifts to a logic 1. If this circuit is defective, the AS line stays at a logic 0 and does not shift to a logic 1. Thus, the $\overline{AS}$ line 792 remains at a logic 1. When the MS cam is dropped, the MS line shifts to a logic 0 producing a logic 1 clocking signal in line 794. This clocks the logic 1 from line 792 to output 796. Thus, one input of gate 734 is a logic 1. This produces a logic 0 fault signal in output 780 of this gate. As mentioned, in normal operation as shown in FIG. 12 a logic 0 remains in the $\overline{AS}$ line for a period after the stop signal of the main stop cam MS. Thus, clocking by shifting the MS line has no effect on the output 796 when the AS circuit is not broken to produce a constant logic 0 in the AS line. Thus, line 796 indicates a fault when the AS cam and its circuit are not operating to check the MS cam operation.

The brake monitor relay 720 is controlled by the brake monitor flip-flop 800 including NOR gates 802, 804. Gate 802 has inputs 810, 812, 814. Flip-flip 800 includes outputs 820, 822. Input 810 is used at the start of a shift when power is applied to the press and the monitor 700. At that time, a logic 1 pulse is received in line 810. Thereafter line 810 is at a logic 0 and has no effect upon gate 802. The setting line for flip-flip 800 is the fault detecting input 812 which is normally at a logic 0. This line is controlled by a capacitor 824 and a pull down resistor 826. A fault is detected by a logic 1 appearing in line 828, which is the output of fault detecting gate 730. Under normal conditions, a logic 0 appears in line 828 to allow discharge of capacitor 824 through resistor 826. Thus, normally input 812 is a logic 0. Input 814 is normally a logic 0 awaiting detection by a logic 1 appearing in line 828. To reset flip-flop 800 to a logic 0 in line 820 at the start of the shift, there is provided a reset NOR gate 830 having three inputs connected to the RESET, MS and AS lines. The output 832 of gate 830 is an input of NOR gate 804 to reset flip-flop 800.

At the start of the shift or initial operation of the press and monitor, line 810, in a manner to be described, shifts to a logic 1 and then back to a logic 0. This produces a logic 0 in line 822 and a logic 1 in line 820. Thereafter, at the start of the day, the RESET line 706 is shifted from its normal logic 1 to a reset logic 0. Thus, all inputs to gate 830 are at a logic 0. This produces a logic 1 in line 832 to reset flip-flop 800 with a logic 0 at the BM line 820 and a logic 1 in line 822. Thereafter, the reset signal shifts to its normal logic 1 condition to produce a logic 0 in line 832. During normal monitoring on a cycle-to-cycle basis by monitor 700, line 832 remains at a logic 0. A logic 0 is assured at the BM line 820 before the first cycle of the press and monitor. Thereafter, flip-flop 800 is controlled by line 812. If 812 is shifted to a fault detection condition, BM line 820 shifts to a logic 1 and remains there until the operator goes through a reset process.

During the start up portion of each press stroke, as shown in FIG. 12, a checking flip-flop 840 is employed. This flip-flop is used primarily to check periodically the operation of the counter in chip 10. This flip-flop includes NOR gates 842, 844. Gate 842 includes inputs 810, 846, and 848. The output of flip-flop 840 is line 850 connected as an input to NAND gate 860 which is the control gate for the brake monitor relay 720. Line 846 is controlled by capacitor 852 connected to the $\overline{MS}$ line and pull down resistor 854. In operation, at the start of a shift a positive pulse appears in input 810. This produces a logic 0 in line 850. During the start cycle, indicated in FIG. 12, the counter in chip 10 times out, in a manner to be described, to produce a logic 1 in input 856 of gate 844. This produces a logic 0 in line 848 and a logic 1 in line 850. Thereafter, voltage will be applied to the main stop cam MS to produce a logic 0 in the $\overline{MS}$ line. To prevent an inadvertent signal in line 846, capacitor 852 maintains a logic 0 in this input to gate 842 as voltage is being applied to the circuit controlled by main stop cam MS. Thus, after the start up and assuming that the counter of chip 10 is operating properly to produce a logic 1 in input 856, a logic 1 is retained in output 850 of flip-flop 840. After the MS cam is dropped, a logic 1 then appears in the $\overline{MS}$ line and is held there during the braking cycle. This discharges capacitor 852 to apply a logic 1 in input 846. This then shifts the output line 850 to a logic 0 to turn off the brake monitor relay, as soon as the MS line is dropped at the start of a braking cycle. The importance of flip-flop 840 during the checking cycle will be explained in connection with the start sequence of monitor 700.

Referring now to the brake monitor relay 720, gate 860 has an output 862 and inputs 822, 850, as previously described. A transistor 864 has a base resistor 866 controlled by the logic on output 862. A coil 890 controls the contact 720a of the brake monitor relay. When coil 890 is energized by transistor 864, contact 720a of the brake monitor relay is closed to apply voltage to the circuit controlled through the position of the main stop or MS cam 702. A blocking diode 892 is provided in parallel with coil 890 in accordance with normal practice. Unless there is a fault, a logic 1 is retained in line 822. As long as the start cycle indicates proper operation of a counter in chip 10, a logic 1 appears in line 850 until the main stop cam is dropped to give a logic 0 in the MS line. Thus, both inputs to gate 860 are normally logic 1. This turns on transistor 864 and energizes coil 890. This closes the contact of the relay to maintain continuity in the circuit including the main stop cam. When a stop signal is supplied and the main stop cam drops to produce a logic 0 in the MS line, flip-flop 840 is shifted to a logic 0 in line 850. This produces a logic 1 in output 862 of gate 860 to turn off the monitor relay 720 to disconnect the voltage controlled by the MS cam. Thus, the MS line logic in FIG. 13 is held to a logic 0 during the braking cycle.

If during the checking cycle, the counter of chip 10 is defective, a logic 1 will not appear in line 856. Thus, line 850 will not be shifted to a logic 1 and the brake monitor relay will not be energized. This will allow a logic 1 to be retained in the $\overline{\text{MS}}$ line to charge capacitor 852 and retain the line 850 in the logic 0 condition. As long as the MS line is in the logic 0 condition, the next cycle of the power press can not be initiated. Thus, flip-flop 850 assures that the monitor press will not operate unless flip-flop 840 is reset during the checking cycle occurring at the start sequence.

Another way of preventing operation of the power press during the next cycle by de-energizing the brake monitor relay is by a fault appearing in line 822 of brake monitor flip-flop 800. When there is a fault, a logic 0 appears in line 822 and the brake monitor relay can not be energized to apply the MS voltage during a subsequent cycle. This shuts down the press until corrective measures are taken. To indicate this condition, there is provided an indicator 900 including a transistor 902 having a base resistor 904 connected to line 822. The coil 906 is connected in parallel with the diode 908 and a light 910. When a fault is indicated by a logic 0 in line 822 from brake monitor flip-flop 800, coil 906 is energized and indicator 910 lighted. The coil 906 is connected to an appropriate blocking system to also prevent operation of the press until corrective measures are taken. Such a system could include switch 906a and control 906b.

Referring now to the pulse control logic 920, a counting NAND gate 922 has inputs 924, 926 and an output 928 connected to the UP counting terminal of chip 10. The checking pulse NAND gate 930 includes inputs 932, 934 and is controlled by a 4 Kc oscillator 936 which directs pulses through line 934 to gate 930. To control the other input 932, there is provided a circuit including NOR gates 940, 942. NOR gate 940 includes an input 810 from the power up circuit, as previously described, input 944 and input 946. A capacitor 947 grounds line 944 to hold it at a logic 0 unless a logic 1 appears in MS line. This charges capacitor 947 through resistor 948 so that when the MS cam or circuit is energized to produce a logic 1, ultimately the logic 1 appears in line 944. The output of gate 940 is the input 932 of gate 930. NOR gate 942 includes input 932 from gate 940 and input 950 connected by capacitor 952 through the output of a start sequence NOR gate 954 having inputs 810 and ST.

Referring now to the operation of the pulse control logic, during the starting sequence for each stroke, there is no voltage on the MS line and the power up line 810 is at a logic 0. Since the brake monitor flip-flop 800 has been reset, a logic 0 appears in line 820. During the starting sequence, a logic 0 appears in the ST line; therefore, a logic 1 is applied to capacitor 952. This produces a logic 0 in line 946. Since all inputs to gate 940 are now a logic 0, a logic 1 is applied to output line 832 which is an input for the pulsing gate 930. Thus, during starting sequence, gate 930 is opened to allow pulses to appear in line 926 at the input of gate 922. Since line 950 is a logic 1 during the starting sequence, a logic 0 appears in line 946 which is one input to the previously mentioned pulsing gate 714. Since this input is a logic 0, a logic 1 appears in line 924 to open steering or counting gate 922. Thus, during the starting cycle of each stroke ST is at a logic 0, counter 20 is receiving 4 Kc counting pulses in line 928 connected to the up counting terminal. During the first part of the starting cycle there is no voltage applied to the MS circuit since brake monitor relay 720 has not yet been actuated by line 850. Chip 10 is shifted to the counting mode. To accomplish this, transistor 962 connected to the MS line by base resistor 964 is conductive as long as the MS line is at a logic 0. Thus, a logic 1 is applied to reset terminal R which allows the counter to count the pulses in line 928. Thus, the counter is allowed to count whenever the MS line is at a logic 0. This occurs when the brake monitor relay 720 is not energized (during the start up checking cycle) or when the stop cam is in a logic 0 condition (during the braking cycle). The output of chip 10 is the - output and appears in line 970 connected to inverter 972 so that the inverted logic of line 970 appears in line 974. When counter 20 counts to the thumb-wheel setting of device 32, a negative pulse, i.e. logic 0 pulse, appears in line 970. This produces a logic 1 pulse in line 974. This logic 1 pulse, in this case occurring during the checking cycle of the start sequence, produces a logic 1 in line 856. This shifts flip-flop 840 to produce a logic 1 in line 850. In this manner, if counter 20 counts to the selected figure at the high rate created by the pulses from oscillator 936, brake monitor relay 720 is energized, assuming that there is no fault detected by line 822 of brake monitor flip-flop 800.

Gate 736 prevents tripping of the fault detecting NAND gate 730 when a pulse is received by line 974. Gate 736 has one input connected to line 974 and another input 976 grounded by capacitor 978 and connected to line 946 by resistor 977. During the starting sequence, a logic 0 appears in line 946 to block counting gate 714. This also applies a logic 0 to input 976 of gate 736. Thus, a normal no fault logic 1 is retained in output line 736a of gate 736 during the checking procedure occurring at the start sequence. This combines with the normal logic 1 of line 780 to hold fault indicating line 828 to a normal logic 0. Thus, during the starting sequence while a logic 0 appears in the ST line, gate 736 is inhibited.

The starting sequence as described above cannot be accomplished if the brake monitor flip-flop 800 has been clocked by a fault signal. This will create a logic 1 in line 820 to hold a logic 0 on capacitor 952. Thus, the starting sequence is possible only if there has not been a fault indicated by a logic on line 780 in a previous cycle.

The power up relay 980 is a somewhat standard circuit including a single input NAND gate 982 as shown schematically at the upper right hand corner of FIG.

13. Of course, various arrangements could be provided for producing a positive or logic 1 non-reoccurring pulse as the power is first applied to the monitor 700. The illustrated circuit is only one of many circuits possible for this purpose.

The monitor 700 has been described in detail with relation to its operation and the circuitry for producing a fault signal in line 780 upon improper operation of certain aspects of the stop cam and auxiliary stop cam. Also, the starting sequence controlled by the logic on the ST line during the initial start up has been described. It is apparent that the ST logic can remain a logic 0 for a prolonged time. Initially, a logic 0 in the ST line produces a logic 1 at the output of gate 954. This produces a logic 1 in line 950 to shift the logic at the output of gate 942. However, after a certain length of time, in practice approximately 50 ms, capacitor 952 discharges through resistor 956 to remove the logic 1 from the input of gate 942. Thus, retaining a logic 0 on the ST line has no effect upon the pulse control logic 920 after capacitor 952 has been discharged. However, before the next start cycle, the ST logic must shift to a logic 1 to produce a logic 0 on capacitor 952. In this manner, the next logic 1 appearing in the starting sequence will produce the necessary logic 1 in line 950 for a short period of time to again cause the starting sequence counter checking operation using the high frequency of oscillator 936.

During normal operation, assuming no fault is indicated by line 780, during the checking cycle a pulse in line 974 shifts line 850 and energizes the brake monitor relay. Contact 720a is closed to apply a logic 1 to the MS line. This produces a logic 1 at the base of transistor 962. Thus, a logic 0 is applied to the reset terminal of chip 10 and prevents counting by the digital counter 20 therein. A logic 1 on the MS line also produces a logic 1 in line 944. This shifts line 932 to a logic 0 to block gate 930. The oscillations of high frequency oscillator 936 can not pass to output 926. This output 926 is retained at a logic 1. In this manner, counting gate 922 is released by line 926 for operation by its second input 924. The logic on line 946 shifts to a logic 1. This opens gate 714 to input 924 of gate 922. When the MS line is at a logic 1, the control pulses are counting pulses in line 928. However, the counter 20 of chip 10 can not count because it is in the reset condition due to the non-conduction of transistor 962.

The control pulses occur each 6° of rotation of the drive shaft of the press since there are 60 evenly spaced elements, such as elements 232 discussed in the first embodiment. Thus, if the press is to be stopped within a certain selected number of degrees, counter 20 needs only to count the number of control pulses after a stop signal applies the brakes and the MS line shifts to a logic 0. Thus, when the MS cam drops out and shifts to a logic 0, transistor 926 immediately conducts and the press brakes are applied. Power is removed from the press drive system. A logic 0 on the MS line releases the reset signal from chip 10 and causes counting of the control pulses created in the output of encoder 710. When only the proper number of pulses is counted, the number set in thumbwheel device 32 will not be reached. Thus, a logic 1 remains in the output line 970 and a logic 0 is retained in line 974. When the MS line shifts to a logic 0, logic 1 is applied to line 846; therefore, the brake monitor relay is de-energized and the MS voltage is held at a logic 0 for the duration of the braking cycle.

If the brake should deteriorate, a larger angle will be required to stop the press after the stop signal is given concurrent with the shift of the MS line to a logic 0. This will cause counting of more pulses than the selected number in device 32 during the braking stroke. When this happens, counter 20 counts out during the braking cycle and a logic 0 appears in line 970. This produces a logic 1 in line 974. Line 946 during the counting cycle is at a logic 1. Thus, gate 936 is open and the positive pulse in line 974 gives a negative pulse in line 736a. This produces a logic 1 pulse in line 828. Thus, capacitor 824 pulls up to a logic 1 and produces a logic 1 in line 812. This shifts flip-flop 800 to produce a logic 0 in line 822. In this manner, transistor 902 becomes conductive to light indicator 910. In addition, coil 906 energizes a system for inhibiting operation of the power press. This system is schematically illustrated as a switch 906a and a stop mechanism 906b. Of course, other arrangements could be used for stopping the press upon the indication of a fault by a shift of logic in line 822. Circuit 900 is also used to detect a fault in the circuitry of cams 702, 704, as mentioned with respect to the logic in line 780. Thus, a fault is detected by circuit 900 which is the indicating circuit and the basic output of monitor 700.

As in the first embodiment of the invention, monitor 700 includes a motion detector 712 which detects when control pulses are received at a rate below a selected rate. This particular system is used to detect motion of the power press drive system and is not used integrally in controlling monitor 700. In the illustrated embodiment of the motion detect circuit 712, there is provided a timer 986 which produces a logic 1 when the spacing between control pulses is beyond a selected time spacing. This system operates similar to the motion detect circuit of the first embodiment. Transistor 988 is connected to the output of timer 986 by a base resistor 989. Coil 990 can control other contacts when transistor 988 is conductive. Blocking diode 992 protects the coil 990 and an indicator light 994 is connected in parallel therewith. In operation, if the speed of the shaft is sufficient to prevent timing out of timer 986, a logic 0 is applied to resistor 989. This forward biases transistor 988 to energize coil 990 and light indicator light 994. In practice, timer 986 is set to approximately 80% of normal operating speed so that as long as the shaft of the press is rotating at or above 80% of normal or intended speed, transistor 988 is conductive. This circuit is used in this embodiment only as an indicator of shaft motion to assure that the shaft is rotating while the monitor M is functioning to monitor the operation of the press braking function.

In this second embodiment of the invention, counter 20 of chip 10 creates a fault signal or pulse when the distance to stop the monitored mechanism exceeds a preselected distance. The first embodiment monitors the stopping time, to produce the fault signal or pulse. In both situations the fault signal is created by a count which exceeds a set count indicative of proper brake action. Distance and time are correlated braking functions.

The two preferred embodiments of the invention are controlled by the angular displacement during the braking interval, i.e. monitor M, and the time of the braking interval, i.e. monitor 70. These two monitored parameters correlated characteristics which can be generally described as allowable tolerances for the braking operation. The monitors of the preferred embodiments are set to indicate whether or not the braking operation is within allowable tolerances. If not a fault signal is created. In the second embodiment, the actual counting pulses are generated by the encoder and thus measure displacement during a braking interval. The counting pulses are generated by a time base frequency from an oscillator in the first embodiment to give an indication of stopping time. The stop signal for both embodiments is generally created in accordance with normal practice and at a certain position in the power press stroke. This stop signal corresponds with the dropping of the MS cam in the two preferred embodiments of the invention. Of course, the stop signal could be created a given angular displacement before the MS cams are dropped. This would produce a slight gap between the actual stop signal and the counting interval of the two monitors so far described. This gap still would allow the counting cycles or intervals of the monitors to be actuated in response to the stop signal. The basic concept of monitoring the braking performance is the time or distance required after the stop signal and before the drive system stops. Of course, the drive system could also be linear in nature and still employ the two preferred embodiments of the invention so far described. In addition, elements of the two embodiments could be interchanged when compatible.

MODIFICATION OF THE PREFERRED EMBODIMENT OF THE INVENTION

As is well known, as the speed of the press changes, the performance of a brake having a given stopping or braking capacity will vary. A properly functioning brake will require more time to stop a press drive system when the system is operating fast at the moment of braking than to stop a press drive system operating slowly. When using the preferred embodiments of the invention, the thumbwheel device 32 is adjusted to monitor absolute time or displacement selected to correspond with the desired operating characteristics of the press being monitored. This thumbwheel device will be manually changed for variations in press speed. In accordance with another aspect of the invention, the two preferred embodiments of the invention can be modified to automatically compensate for variations in the speed of the power press or other drive systems. In accordance with this aspect of the invention, the speed of the drive system is measured during a stroke and prior to the stop signal. The counting sequence of the monitor is then automatically modified according to the measured speed or velocity of the drive system. Such an arrangement could be used on both illustrated embodiments. Referring to the first preferred embodiment of the invention, it is possible to increase the set time or count if the speed of the press is above that for which thumbwheel device 32 is originally set. A variety of systems could be used for this function; however, in accordance with the preferred embodiment of this aspect of the invention, an adjusting system 1000 is shown in FIG. 14. This system incorporates a flip-flop 1010 which is reset to logic 0 by the $\overline{\text{MS}}$ signal which is shown as the MS voltage passed through an inverter 1011. In a like manner, flip-flop 1010 can be set to a logic 1 by a ZERO SENSE line 1012 connected to the output of an up/down counter 1020 and triggering a one shot device 1014. This up/down counter could be a second chip 10 having up counting terminal 1022 and down counting terminal 1024. In this embodiment, counter 1020 does not down count below zero. When the stop signal (MS) is provided, flip-flop 1010 is reset to a logic 0. This logic 0 is connected by the Q terminal to reset line 329 of monitor M in the first preferred embodiment of the invention. If the system of FIG. 14 were used in the second preferred embodiment of the invention, the Q terminal of flip-flop 1010 could be connected to the reset terminal of chip 10, as shown in FIG. 13. In either instance, when a stop signal (MS) is created to drop out the MS voltage, the basic counting chip is reset and will not count. This holding circuit is retained until an output is received from counter 1020 on line 1012. The holding time is proportionate to the speed of the drive system before the stop signal is created. The faster the speed of the drive mechanism during the sampling period, to be explained later, the longer the holding circuit retains the basic counter in a reset condition. This provides a gap before the counting interval of the basic embodiments of the invention dependent upon the actual speed or velocity of the drive system. The faster the drive system is traveling, the longer the time delay gap or holding circuit prevents basic counting of the two preferred embodiments. This is consistent with parameter statements indicating that a brake functioning properly will require more time to stop the drive system after the stop signal is received if the drive system is operating at a higher velocity. The inverse is true. At lower velocities, a reduced holding time or delay time is needed after the stop signal and before counting. Thus, at a slower speed, a properly operating brake will stop the drive system at a reduced time.

The basic control of the holding or time delay circuit is counter 1020 which is counted up in a manner to indicate the speed of the press and is counted down to zero at a time base frequency, which in the preferred embodiment, is quite rapid compared to the up counting sequence.

Referring now to the up counting system for determining the speed of the drive mechanism or system during a given stroke, the basic control pulses are received from the standard encoder 240. Gate 1030 receives the encoder pulses through line 1032. This AND gate has a second input 1034 which is the Q terminal of flip-flop 1040. This flip-flop is set to a logic 1 by the CK line which is created during the checking or testing portion of the first embodiment of the invention. This checking voltage which shifts to a logic 0 is inverted by inverter 1042 and drives a one shot device 1044. When the checking or testing cycle is opened, one shot device 1044 sets flip-flop 1040 to a logic 1. This allows gate 1040 to pass the pulses from encoder 240 as they appear in line 1032. Thus, counter 1020 is counting up as pulses are received from the encoder which are received at a rate indicative of the velocity of the drive system. This up counting continues for a preset time determined by the reset line 1050 for flip-flop 1040. This reset time, in the illustrated embodiment, is 100 ms. Thus, when a logic 1 appears in line 1050, flip-flop 1040 is reset to logic 0. The Q line 1034 then shifts to a logic 0 which blocks further up counting pulses through AND gate 1030. Flip-flop 1040 creates a 100 ms window for the up counting sequence. Since the incoming pulses are indicative of velocity and are allowed to pass to the up counting line 1022 for a set time, the number of pulses counted up by counter 1020 is indicative of the velocity of the drive system during the 100 ms counting window. To produce this counting window, various arrangements could be provided. One of these arrangements includes the counter 1052 which produces an output pulse at 100 counts. This counter is driven by the 1 Kc oscillator output line 344 through an AND gate 1060. The other input 1062 of AND gate 1060 is controlled by flip-flop 1070 which is set to a logic 1 by $\overline{CK}$ line created by inverter 1074. In a like manner, the flip-flop 1070 is reset to a logic 0 by the MS line created with inverter 1072. Thus, when the window is initiated by the one shot device 1044, flip-flop 1070 is set to a logic 1 by the lack of a checking voltage. This produces a logic 1 in input 1062 of gate 1060. Consequently, the 1 Kc pulses are counted by counter 1052. When the count reaches 100, corresponding to 100 ms, an output is created in line 1050 which resets flip-flop 1040 and closes the counting gate 1030. When the stop signal (MS) is created, flip-flop 1070 is reset to a logic 0 awaiting the next sampling sequence. Thus, during the checking cycle of the first embodiment of the invention, the counter 1020 receives a selected number of pulses which are indicative of the actual velocity of the drive system prior to the stop signal (MS).

When the stop signal is received, a counting interval is started to monitor brake performance. By using the system shown in FIG. 14, this can not happen until a logic 1 appears in line 1012. This occurs when counter 1020 is counted down to zero. The logic 0 triggers one shot device 1014. To do this, counter 1020 must be counted down or drained of the counts accumulated during the up counting cycle. A variety of circuits could be used for this purpose; however, in the illustrated embodiment, an AND gate 1080 controls down counting line 1024. This gate has a 4 Kc input line 338 and a $\overline{MS}$ input created by inverter 1082. Thus, when the stop signal (MS) is created and the MS line shifts to a logic 0, gate 1080 is opened. This starts down counting of counter 1020 until a logic 1 is produced in line 1012 at the zero count at which time counter 1020 stops. This sets flip-flop 1010 to a logic 1 and thereby allows normal operation of monitor M, as previously described. At the same time, line 1012 triggers one shot device 1090 to reset counter 1052 to a zero count position.

As shown in FIG. 15, the system of FIG. 14 produces an adjustable gap before counting is started in the brake monitors. This time delay or adjustment is speed responsive. By using the 1 Kc and 4 Kc which are available in the first preferred embodiment of the invention, the speed adjustment is correlated to normal operations of an adjustable speed power press. For instance, when a power press is operating at a somewhat normal 20 rpms, a nominal stopping time of approximately 180 ms is realized. At a low speed of approximately 10 rpm, the same brake will stop the power press in approximately 175 ms. At a high speed of approximately 40 rpms, the same brake will stop the power press in approximately 185 ms. Thus, there is a range of approximately 10 ms between high speed operation and low speed operation for a given properly operating brake. By adjusting the counter 1052 and the draining rate for counter 1020, an approximation of the desired swing in gap timing corresponding to the desired swing in normal brake operation is obtained. The values used in the preferred embodiment of the present invention approximate this desired operation using the available oscillator pulses of the first embodiment of the present invention. Various adjustments could be made to compensate for different braking operations. However, the same basic feature is realized. The monitored point for a rapidly operating press can be shifted in time compared with the monitored point of a slowly operating press for the same brake condition. Thus, if a brake has deteriorated, it can be detected rapidly even though the press is operating at slow speed. Other modifications could be used to obtain this speed responsive monitor adjustment.

Having thus defined the invention, it is claimed:

1. An electronic monitoring device for indicating when the stopping time of a brake adapted to stop the motion of a mechanical drive system upon receipt of a stop signal exceeds a preselected time, said drive system having a shaft rotating at a velocity corresponding to said motion of said drive system, means for creating a stop signal and means for applying said brake in response to said stop signal, said monitoring device comprising: a digital counter having an input for counting pulses; means for starting a counting interval of said counter in response to said stop signal; means for terminating said counting interval when said shaft is stopped; means for applying counting pulses to said counter input; means for creating a first signal when said digital counter has counted to a selected number indicative of proper brake action; means creating a second signal when said shaft has stopped; indicating means actuated upon creation of said first signal before said second signal; means for creating a checking counting interval for said counter prior to said stop signal, means for creating a generally fixed time base train of counting pulses, said frequency being sufficient to count to said selected number during said checking counting interval, and means responsive to lack of creation of said first signal during said checking counting interval for creating a drive system shut down signal.

2. An electronic monitoring device for indicating when the stopping time of a brake adapted to stop the motion of a mechanical drive system upon receipt of a stop signal exceeds a preselected time, said drive system having a shaft rotating at a velocity corresponding to said motion of said drive system, means for creating a stop signal and means for applying said brake in response to said stop signal, said monitoring device comprising: means for creating a control pulse upon rotation of said shaft through each of successive angular sectors; a digital counter having an input means for receiving counting pulses and means for enabling said counter upon creation of an enabling signal; logic means for creating said enabling signal upon creation of a stop signal; means for stopping counting of said counter upon stopping of said shaft; means for directing said control pulses to said counter at least while said counter is counting; means responsive to said counter counting to a selected number representative of a shaft angular displacement after said stop signal for creating a fault signal and means for manually changing said selected number.

3. An electronic monitoring device as defined in claim 2 including means for delaying said counter starting means for a given time period after said stop signal.

4. An electronic monitoring device for indicating when the stopping time of a brake adapted to stop the motion of a mechanical drive system upon receipt of a stop signal exceeds a preselected time, said drive system having a shaft rotating at a velocity corresponding to said motion of said drive system, means for creating a stop signal and means for applying said brake in response to said stop signal, said monitoring device comprising: means for creating control pulses having a time spacing between successive control pulses inversely proportional to the rotational velocity of said shaft; a digital counter having an input for counting pulses and means for starting said counter upon creation of said stop signal; means for creating counting pulses having a known time base frequency; means for directing said counting pulses to the input of said digital counter; means for creating a first signal when said digital counter has counted to a selected number; means for creating a second signal when said time spacing of successive control pulses exceeds a selected time; and indicating means actuated upon creation of said first signal before creation of said second signal.

5. An electronic monitoring device as defined in claim 4 including means for delaying said counter starting means for a given time period after said stop signal.

6. An electronic monitoring device as defined in claim 5 including means for adjusting said given time period.

7. An electronic monitoring device as defined in claim 5 including means for measuring the velocity of said drive system prior to said stop signal and means for adjusting said given time period in direct proportion to said measured velocity.

8. An electronic monitoring device as defined in claim 4 wherein said control pulse creating means includes a transducer exposed to said shaft; a series of signal creating elements equally spaced circumferentially around said shaft and means for creating one of said control pulses when one of said elements passes said transducer.

9. An electronic monitoring device as defined in claim 4 including a visual display device and means for causing said display device to display the count condition of said counter.

10. An electronic monitoring device as defined in claim 4 wherein said counter starting means includes means for applying a resetting signal to said counter and means for releasing said resetting signal upon creation of said stop signal.

11. An electronic monitoring device as defined in claim 4 wherein said counting pulse creating means includes an oscillator for creating said counting pulses.

12. An electronic monitoring device as defined in claim 11 wherein said directing means includes a logic gate and means for inhibiting said gate upon creation of said second signal.

13. An electronic monitoring device as defined in claim 4 including means for creating a drive system shut down signal upon creation of said first signal after a stop signal.

14. An electronic monitoring device as defined in claim 4 including means for adjusting said selected number.

15. An electronic monitoring device as defined in claim 4 wherein said second pulse creating means includes a timer having an input and an output, said timer output having a first logic condition and a second logic condition, means responsive to each control pulse for holding said output in said first logic condition for a controlled time, means allowing said timer output to shift to said second logic condition after a controlled time has expired without a subsequent control pulse, and means responsive to said timer output shifting to said second logic condition for creating said second signal.

16. An electronic monitoring device as defined in claim 4 including a checking system, said system including means for allowing said counter to count for a checking time period prior to creation of a stop signal, means responsive to lack of creation of said first signal during said time period for creating a drive system shut down signal.

17. An electronic monitoring device as defined in claim 16 including means for increasing the time base frequency of said counting pulses during said checking time period.

18. An electronic monitoring device as defined in claim 4 including means for adjusting said selected time of said second signal creating means.

19. An electronic monitoring device as defined in claim 18 wherein said adjusting means adjusts said selected time between 2.5 and 50 Ms.

20. An electronic monitoring device for indicating when the stopping time of a brake adapted to stop the motion of a mechanical drive system upon receipt of a stop signal exceeds a preselected time, said system having means for creating a stop signal and applying said brake, said monitoring device comprising: a digital counter having an input for counting pulses and means for creating an output signal when said counter counts a selected number of pulses; first means responsive to said stop signal for applying a first train of pulses to said counter input, said first train of pulses having an effective time base frequency; second means for applying a second train of pulses to said counter input for a time period prior to said stop signal; and an oscillator for creating said second train of pulses with a second time base frequency substantially higher than the effective frequency of said first train of pulses, said second time base frequency being sufficient for said counter to reach said selected number during said time period.

21. An electronic monitoring device as defined in claim 20 including means for adjusting said selected number.

22. An electronic monitoring device for indicating when the stopping time of a brake adapted to stop the motion of a mechanical drive system upon receipt of a stop signal exceeds a preselected time, said drive system having a shaft rotating at a velocity corresponding to said motion of said drive system, means for creating a stop signal and means for applying said brake in response to said stop signal, said monitoring device comprising: a digital counter having an input for counting pulses; means for starting a counting interval of said counter in response to said stop signal; means for terminating said counting interval when said shaft is stopped; means for applying counting pulses to said counter input; means for creating a first signal when said digital counter has counted to a selected number indicative of proper brake action; means creating a second signal when said shaft has stopped; indicating means actuated upon creation of said first signal before said second signal; and means for delaying said count interval starting means for a given time period after said stop signal.

23. An electronic monitoring device as defined in claim 22 including means for adjusting said given time period.

24. An electronic monitoring device as defined in claim 22 including means for measuring the velocity of said drive system prior to said stop signal and means for adjusting said given time period in direct proportion to said measured velocity.

25. An electronic monitoring device for a drive system having a braking system adapted to stop the said drive system, said monitoring device being used for indicating when said braking system fails to stop said drive system within an allowable tolerance, said drive system including means for initiating operation of said braking system in response to a stop signal, said monitoring device including: means for generating pulses having a selected number which, if exceeded, is indicative of said stopping by said braking system being beyond said allowable tolerance; digital means for receiving said pulses and for counting said pulses toward said selected number in a counting interval; means for starting said counting interval in response to said stop signal; means for terminating said counting interval when said driven member is stopped; means for generating a signal in response to counting to said selected number during said counting interval; and indicator means responsive to generation of said signal for indicating when said braking system is stopping said drive system outside said allowable tolerance; and means for delaying said counting interval starting means for a given time period after said stop signal.

26. An electronic monitoring device as defined in claim 25 including means for adjusting said given time period.

27. An electronic monitoring device as defined in claim 25 including means for measuring the velocity of said drive system prior to said stop signal and means for adjusting said given time period in direct proportion to said measured velocity.

28. An electronic monitoring device for a drive system having a braking system adapted to stop said drive system, said monitoring device being used for indicating when said braking system fails to stop said drive system within an allowable tolerance, said drive system including means for initiating operation of said braking system in response to a stop signal, to stop said drive system in a braking interval determined by the stopping characteristics of said braking system, said monitoring device comprising: means for generating pulses having a known relationship to said allowable tolerance; means for creating a counting interval corresponding to said braking interval; digital means for counting said pulses during a counting interval, said digital means includes means for creating a fault signal when said counting means counts to a given number indicative of operation of said braking system outside said allowable tolerance; means for displaying said given number; means for changing said given number; means for indicating the creation of said fault signal; and said pulse generating means being a device for creating a pulse when said drive system is moved a selected angular distance.

29. An electronic monitoring device as defined in claim 28 including means for changing said counting interval in response to changes in the speed of said drive system.

30. An electronic monitoring device for a drive system having a braking system adapted to stop said drive system, said monitoring device being used for indicating when said braking system fails to stop said drive system within an allowable tolerance, said drive system including means for initiating operation of said braking system in response to a stop signal, to stop said drive system in a braking interval determined by the stopping characteristics of said braking system, said monitoring device comprising: means for generating pulses having a known relationship to said allowable tolerance; means for creating a counting interval corresponding to said braking interval; digital means for counting said pulses during a counting interval, said digital means includes means for creating a fault signal when said counting means counts to a given number indicative of operation of said braking system outside said allowable tolerance; means for displaying said given number; means for changing said given number; means for indicating the creation of said fault signal; and said pulse generating means being an oscillator means for producing pulses at a generally fixed time based rate.

* * * * *